US012334350B2

(12) United States Patent
Lin et al.

(10) Patent No.: US 12,334,350 B2
(45) Date of Patent: Jun. 17, 2025

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Meng-Yu Lin, New Taipei (TW); Chun-Fu Cheng, Hsinchu County (TW); Cheng-Yin Wang, Taipei (TW); Yi-Bo Liao, Hsinchu (TW); Szuya Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 396 days.

(21) Appl. No.: 17/861,236

(22) Filed: Jul. 10, 2022

(65) Prior Publication Data
US 2024/0014042 A1    Jan. 11, 2024

(51) Int. Cl.
*H01L 21/28*        (2025.01)
*H01L 21/3213*      (2006.01)
*H10D 30/01*        (2025.01)
*H10D 30/43*        (2025.01)
*H10D 30/67*        (2025.01)
(Continued)

(52) U.S. Cl.
CPC .. *H01L 21/28123* (2013.01); *H01L 21/32134* (2013.01); *H01L 21/32135* (2013.01); *H01L 21/32139* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 84/0172* (2025.01);
(Continued)

(58) Field of Classification Search
CPC ......... H01L 21/28123; H01L 21/32134; H01L 21/32135; H10D 30/014; H10D 84/0186; H10D 30/6757; H10D 62/121; H10D 84/0172; H10D 30/6735; H10D 30/43; H10D 88/01; H10D 84/038; H10D 84/856; H10D 30/031
See application file for complete search history.

(56) References Cited

U.S. PATENT DOCUMENTS 9,209,247 B2   12/2015  Colinge et al.
9,236,267 B2   1/2016   De et al.
(Continued)

*Primary Examiner* — Richard A Booth
(74) *Attorney, Agent, or Firm* — JCIPRNET

(57) ABSTRACT

A semiconductor device includes a fin, first source/drain regions, second source/drain regions, a first nanosheet, a second nanosheet and a metal gate structure. The fin extends in a first direction and protrudes above an insulator. The first source/drain regions are over the fin. The second source/drain regions are over the first source/drain regions. The first nanosheet extends in the first direction between the first source/drain regions. The second nanosheet extends in the first direction between the second source/drain regions. The metal gate structure is over the fin and between the first source/drain regions. The metal gate structure extends in a second direction different from the first direction from a first sidewall to a second sidewall. A first distance in the second direction between the first nanosheet and the first sidewall is smaller than a second distance in the second direction between the first nanosheet and the second sidewall.

20 Claims, 24 Drawing Sheets

(51) Int. Cl.
*H10D 62/10* (2025.01)
*H10D 84/01* (2025.01)
*H10D 84/03* (2025.01)
*H10D 84/85* (2025.01)
*H10D 88/00* (2025.01)

(52) U.S. Cl.
CPC ....... *H10D 84/0186* (2025.01); *H10D 84/038* (2025.01); *H10D 84/856* (2025.01); *H10D 88/01* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,728,407 B2 * | 8/2023 | Wang .................. H10D 84/834 257/401 |
| 2023/0131688 A1 * | 4/2023 | Lee ...................... H10D 64/017 257/347 |
| 2023/0155002 A1 * | 5/2023 | Chiu ................... H10D 62/118 257/347 |

* cited by examiner

SEMICONDUCTOR DEVICE AND METHOD OF MANUFACTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
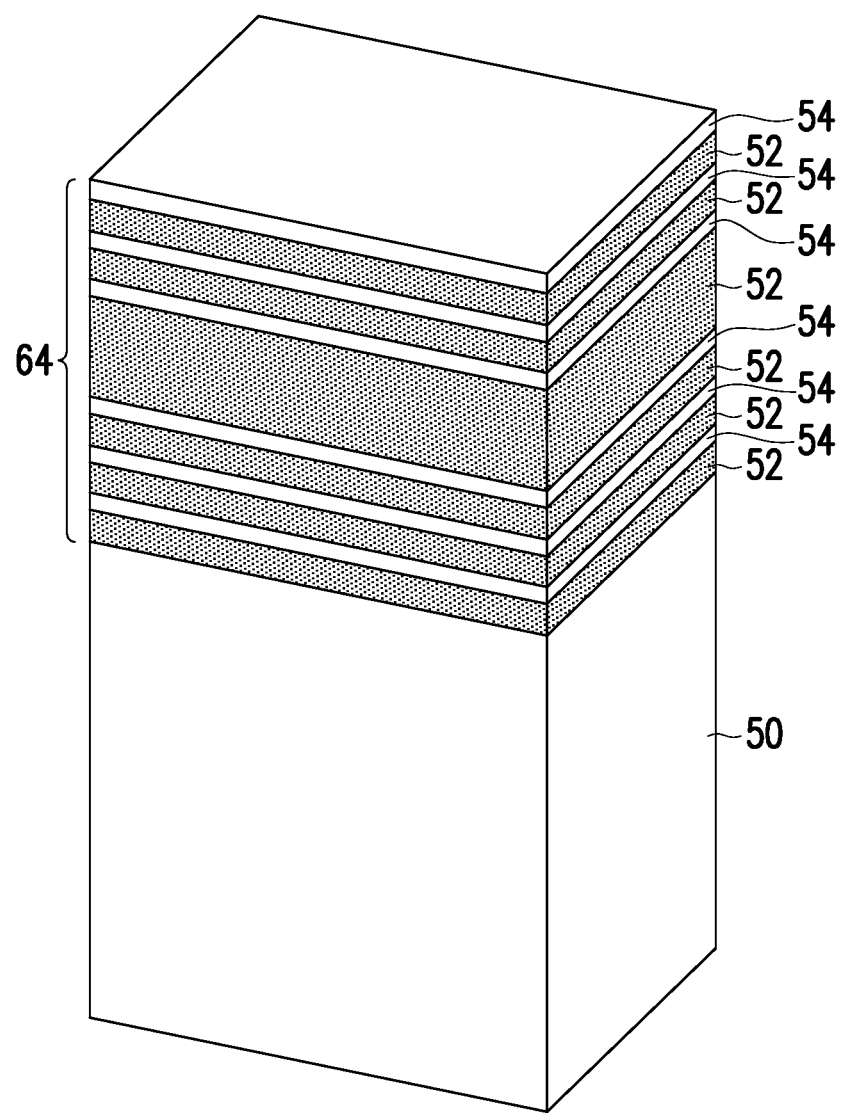
FIGS. 1-3, 4A, and 16A are stereoscopic views of a complementary field-effect transistor (CFET) device at various stages of manufacturing, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-3, 4A-4B, and 5-15 and 16A-16D illustrate manufacturing of a complementary field-effect transistor (CFET) device 100 at various stages, in accordance with an embodiment. FIGS. 1-3, 4A, and 16A are schematic stereoscopic views of the structure in various stages, FIGS. 4B, 5-15, and 16B are cross-sectional views along cross-section A-A' in FIGS. 4A and 16A, FIG. 16C is cross-sectional view along cross-section B-B' in FIG. 16A, and FIG. 16D is cross-sectional view along cross-section C-C' in FIG. 16A. Although one fin and three gate structures are illustrated in the figures as a non-limiting example, it should be appreciated that other numbers of fins and other numbers of gate structures may also be formed.

In FIG. 1, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. The number of layers formed by the first and the semiconductor materials illustrated in FIG. 1 are merely non-limiting examples. Other numbers of layers are also possible and are fully intended to be included within the scope of the present disclosure.

In some embodiments, the first semiconductor material 52 is an epitaxial material such as silicon germanium ($Si_xGe_{1-x}$, where x can be in the range of 0 to 1), and the second semiconductor material 54 is an epitaxial material such as silicon. The multi-layer stacks 64 (may also be referred to as an epitaxial material stack) will be patterned to form channel regions of an CFET in subsequent processing. In particular, the multi-layer stacks 64 will be patterned to form horizontal nanosheets, with the channel regions of the resulting CFET including multiple horizontal nanosheets.

The multi-layer stacks 64 may be formed by an epitaxial growth process, which may be performed in a growth chamber. In an embodiment, during the epitaxial growth process, the growth chamber is cyclically exposed to a first set of precursors for selectively growing the first semiconductor material 52, and then exposed to a second set of precursors for selectively growing the second semiconductor material 54, in some embodiments. The cyclical exposure may be repeated until a target quantity of layers is formed.

Figure 2:
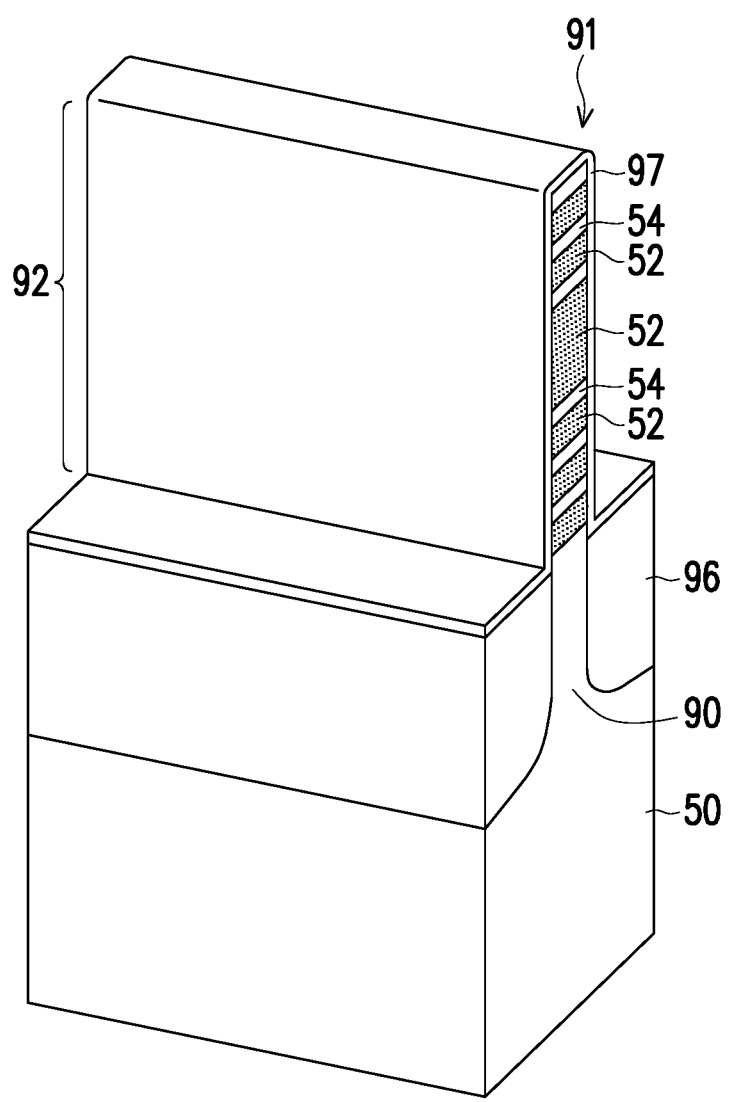

In FIG. 2, fin structures 91 are formed protruding above the substrate 50. Each of the fin structures 91 includes a semiconductor fin 90 and a nanostructure 92 overlying the semiconductor fin 90. The nanostructures 92 and the semiconductor fins 90 may be formed by etching trenches in the multi-layer stack 64 and the substrate 50, respectively.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structures 91.

In some embodiments, the remaining spacers are used to pattern a mask (not shown), which is then used to pattern the fin structures 91. The mask may be a single layer mask, or may be a multilayer mask such as a multilayer mask that includes a first mask layer and a second mask layer. The first mask layer and second mask layer may each be formed from a dielectric material such as silicon oxide, silicon nitride, a combination thereof, or the like, and may be deposited or thermally grown according to suitable techniques. The first mask layer and second mask layer are different materials having a high etching selectivity. The mask may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the nanostructures 92, and the patterned substrate 50 form the semiconductor fins 90, as illustrated in FIG. 2. Therefore, in the illustrated embodiment, the nanostructure 92 also includes alternating layers of the first semiconductor material 52 and the second semiconductor material 54, and the semiconductor fin 90 is formed of a same material (e.g., silicon) as the substrate 50.

Next, Shallow Trench Isolation (STI) regions 96 are formed over the substrate 50 and on opposing sides of the fin structures 91. As an example to form the STI regions 96, an insulation material may be formed over the substrate 50. The insulation material may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In an embodiment, the insulation material is formed such that excess insulation material covers the fin structures 91.

Next, a removal process is applied to the insulation material to remove excess insulation material over the fin structures 91. In some embodiments, a planarization process such as a chemical mechanical polish (CMP), an etch back process, combinations thereof, or the like may be utilized. The planarization process exposes the nanostructures 92 such that top surfaces of the nanostructure 92 and the insulation material are level after the planarization process is complete. Next, the insulation material is recessed to form the STI regions 96. The insulation material is recessed such that the nanostructures 92 protrude from between neighboring STI regions 96. Top portions of the semiconductor fins 90 may also protrude from between neighboring STI regions 96. The STI regions 96 may be recessed using an acceptable etching process, such as one that is selective to the material of the insulation material. For example, a chemical oxide removal with a suitable etchant such as dilute hydrofluoric (dHF) acid may be used.

Still referring to FIG. 2, a dummy dielectric layer 97 is formed over the nanostructures 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the nanostructure 92 and over the upper surface of the STI regions 96, and a thermal oxidation process is performed to convert the deposited silicon layer into an oxide layer as the dummy dielectric layer 97.

Figure 3:
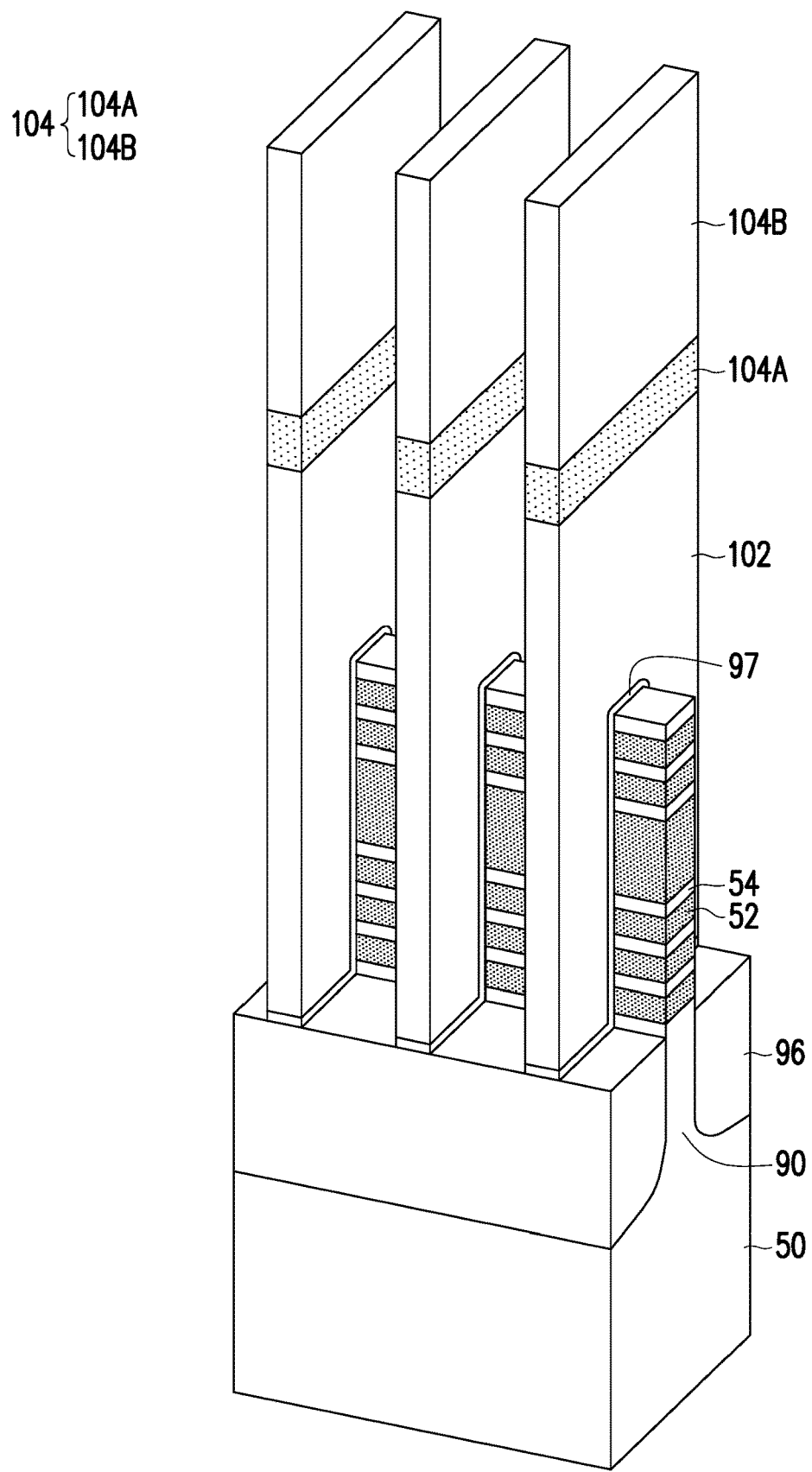
Figure 4A:
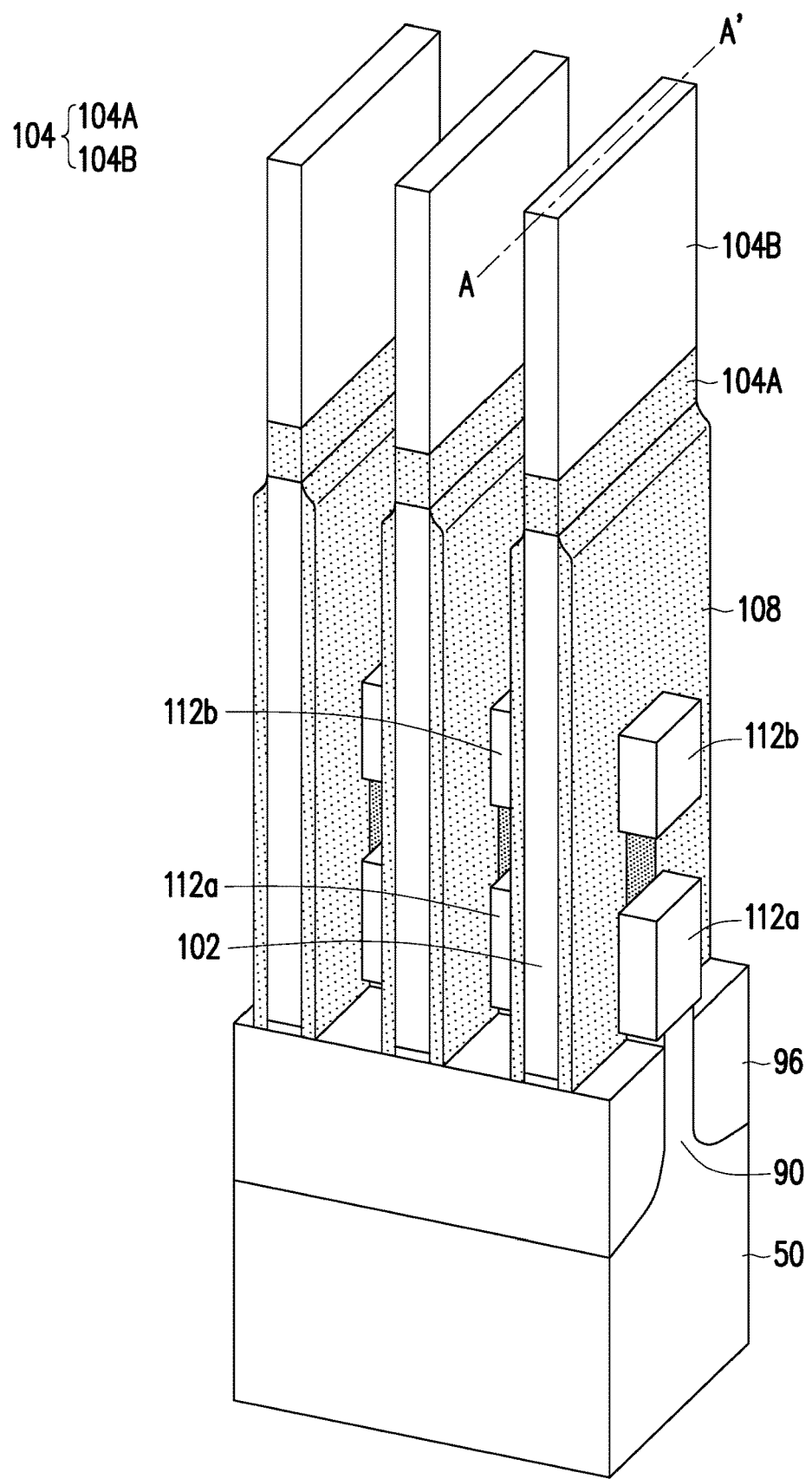

Next, in FIG. 3, dummy gates 102 are formed over the fins 90 and over the nanostructures 92. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), polycrystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the nanostructures 92. The pattern of the masks 104 may be used to physically separate each of the dummy gates 102 from adjacent dummy gates. The dummy gates 102 may also have a lengthwise direction substantially perpendicular to the lengthwise direction of the fins 90. The dummy gate 102 and the dummy gate dielectric 97 are collectively referred to as dummy gate structure, in some embodiments.

Figure 4B:
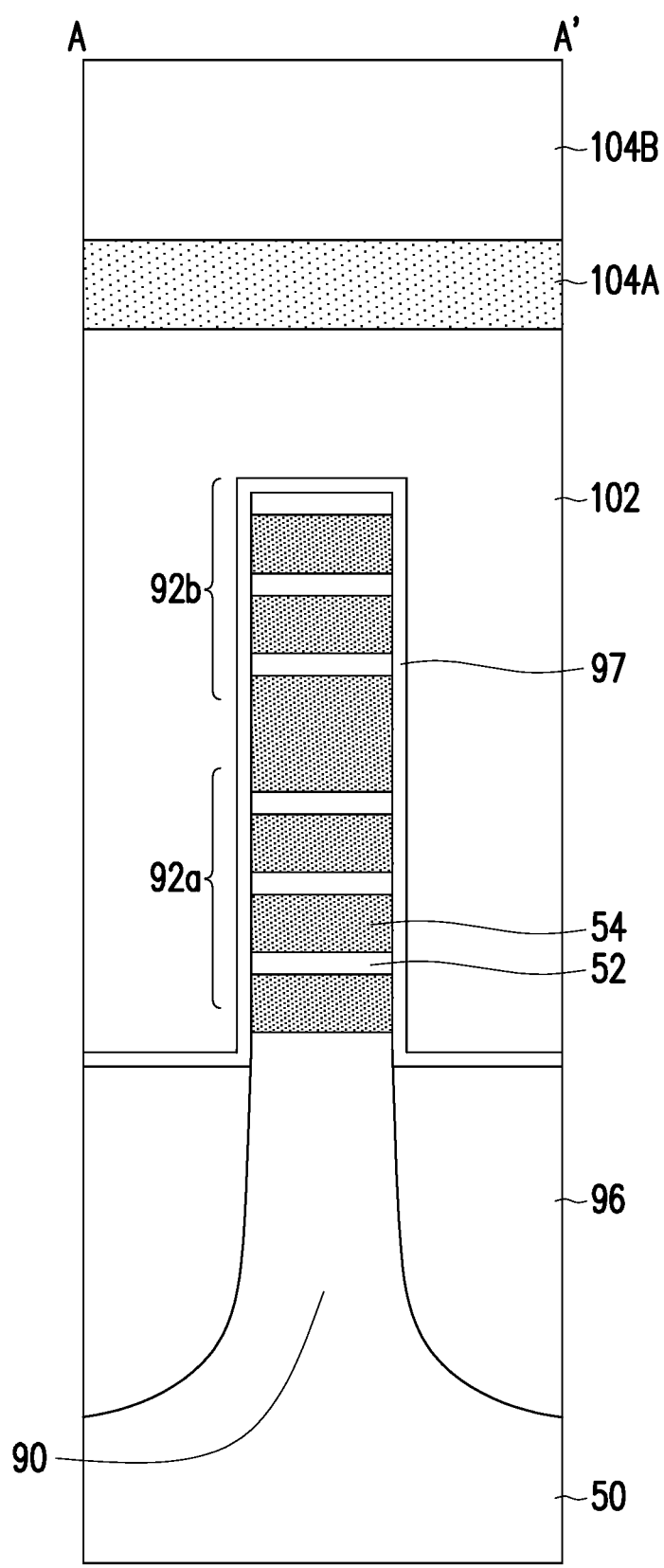
FIGS. 4B, 5-15, and 16B-16D are cross-sectional views of a CFET device at various stages of manufacturing, in accordance with an embodiment.

Next, in FIGS. 4A and 4B, a gate spacer layer 108 is formed by conformally depositing an insulating material over the nanostructures 92, STI regions 96, and dummy gates 102. The insulating material may be silicon nitride, silicon carbonitride, a combination thereof, or the like. In some embodiments, the gate spacer layer 108 includes multiple sublayers.

Next, the gate spacer layers 108 are etched by an anisotropic etching process to form gate spacers 108. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric 97) forming the gate spacers 108.

In some embodiments, the portions of the gate spacers layers 108 disposed on the upper surface of the STI regions 96 between neighboring fins are completely removed by the anisotropic etching process.

After the formation of the gate spacers 108, implantation for lightly doped source/drain (LDD) regions (not shown) may be performed. Appropriate type (e.g., p-type or n-type) impurities may be implanted into the exposed nanostructures 92 and/or semiconductor fins 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ cm$^{-3}$ to about $10^{16}$ cm$^{-3}$. An anneal process may be used to activate the implanted impurities.

Next, openings (not shown) (may also be referred to as recesses) are formed in the nanostructures 92. The openings may extend through the nano structures 92 and into the semiconductor fins 90. The openings may be formed by any acceptable etching technique, using, e.g., the dummy gates 102 as an etching mask.

After the openings are formed, a selective etching process is performed to recess end portions of the first semiconductor material 52 exposed by the openings without substantially attacking the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers (not shown).

Next, first source/drain regions 112a are formed in the openings. In the illustrated embodiment, the first source/drain regions 112a are formed of an epitaxial material(s), and therefore, may also be referred to as epitaxial source/drain regions. The first source/drain regions 112a are formed such that each dummy gate 102 is disposed between respective neighboring pairs of the first source/drain regions 112a. In some embodiments, the gate spacers 108 are used to separate the first source/drain regions 112a from the dummy gates 102 by an appropriate lateral distance so that the first source/drain regions 112a do not short out subsequently formed gates of the resulting CFET device.

The first source/drain regions 112a are epitaxially grown in the openings. The first source/drain regions 112a may include any acceptable material, such as appropriate for n-type or p-type device. In the illustrated embodiment, when n-type devices are formed, the first source/drain regions 112a may include materials exerting a tensile strain in the channel regions, such as silicon, SiC, SiCP, SiP, or the like. Likewise, when p-type devices are formed, the first source/drain regions 112a may include materials exerting a compressive strain in the channel regions, such as SiGe, SiGeB, Ge, GeSn, or the like. The first source/drain regions 112a may have surfaces raised from respective surfaces of the fins and may have facets.

The first source/drain regions 112a and/or the fins may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the first source/drain regions 112a may be in situ doped during growth. As a result of the epitaxy processes used to form the first source/drain regions 112a, upper surfaces of the first source/drain regions 112a have facets which expand laterally outward beyond sidewalls of the fins 90.

Specifically, the first source/drain regions 112a are formed on opposing sides of the first portion 92a of the nanostructures 92. As shown in FIGS. 4A and 4B, for illustration, the first portion 92a of the nanostructures 92 includes a portion of the first semiconductor material 52 and a portion of the second semiconductor material 54 that are closer to the substrate 601 and the insulation 602, compared with a second portion 92b of the nanostructures 92. In the present embodiment, the first source/drain regions 112a are included in a n-type FET.

In various embodiments, the first source/drain regions 112a are formed on opposite sides of both of the first portion 92a and the second portion 92b of the nanostructures 92. After forming the first source/drain regions 112a, the first source/drain regions 112a are recessed, by a dry etching and/or wet etching or other suitable methods.

In some embodiments, an insulator (not shown) is formed on the first source/drain regions 112a. In various embodiments, the formation of the insulator includes, for example, the deposition and etches. In some embodiments, the insulator is made of a silicon nitride (SiN), which is formed by CVD, including, for example, low pressure CVD (LPCVD) and plasma enhanced CVD (PECVD), physical vapor deposition (PVD), atomic layer deposition (ALD), or other suitable process.

Next, second source/drain regions 112b are formed on opposing sides of the second portion 92b of the nanostructures 92, as shown in FIGS. 4A and 4B. In various embodiments, the formation of the second source/drain regions 112b includes, for example, deposition, ion implantation, chemical mechanical polish and etches, as illustrated with respect to the first source/drain regions 112a. In the present embodiment, the second source/drain regions 112b are included in a p-type FET.

Figure 5:
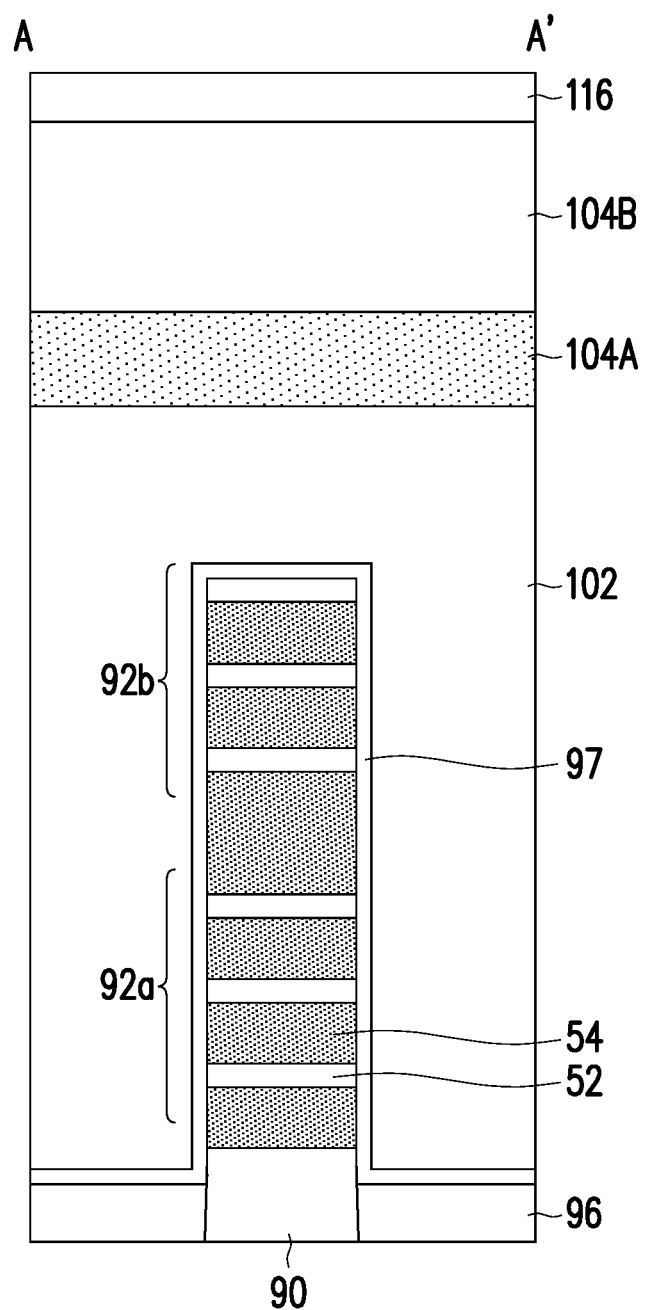

Next, in FIG. 5, a contact etch stop layer (CESL) 116 may be formed (e.g., conformally) over the first source/drain regions 112a, second source/drain regions 112b, and over the dummy gate 102, and a first inter-layer dielectric (ILD) (not shown) may be then deposited over the CESL 116. The CESL 116 is formed of a material having a different etch rate than the first ILD, and may be formed of silicon nitride using PECVD, although other dielectric materials such as silicon oxide, silicon oxynitride, combinations thereof, or the like, and alternative techniques of forming the CESL 116, such as low-pressure CVD (LPCVD), PVD, or the like, could alternatively be used.

The first ILD may be formed of a dielectric material, and may be deposited by any suitable method, such as CVD, plasma-enhanced CVD (PECVD), or FCVD. Dielectric materials for the first ILD may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Figure 6:
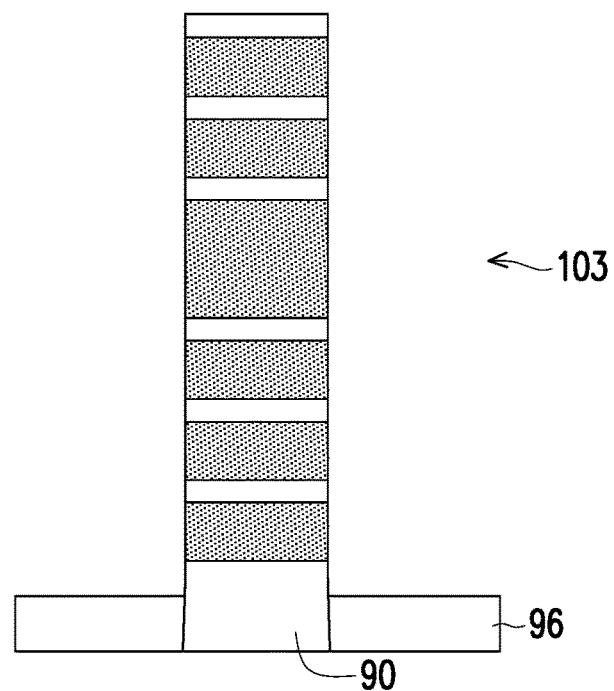

Next, in FIG. 6, the dummy gates 102 are removed. To remove the dummy gates 102, a planarization process, such as a CMP, is performed to level the top surfaces of the first ILD and CESL 116 with the top surfaces of the dummy gates 102 and gate spacers 108. The planarization process may also remove the masks 104 (see FIGS. 4A and 4B) on the dummy gates 102, and portions of the gate spacers 108 along sidewalls of the masks 104. After the planarization process, top surfaces of the dummy gates 102, gate spacers 108, and first ILD are level. Accordingly, the top surfaces of the dummy gates 102 are exposed through the first ILD.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD or the gate spacers 108. Each recess 103 exposes a channel region of the CFET device. Each channel region is disposed between neighboring pairs of the first source/drain regions 112a or between neighboring pairs of the second source/drain regions 112b. During the removal of the dummy gates 102, the dummy gate dielectric 97 may be used as an etch stop layer when the dummy gates 102 are etched. The dummy gate dielectric 97 in the recesses 103 may then be removed after the removal of the dummy gates 102. An etching process, such as an isotropic etching process, may be performed to remove the dummy gate dielectric 97. In an embodiment, an isotropic etching process using an etching gas that comprises HF and NH3 is performed to remove the dummy gate dielectric 97.

Figure 7:
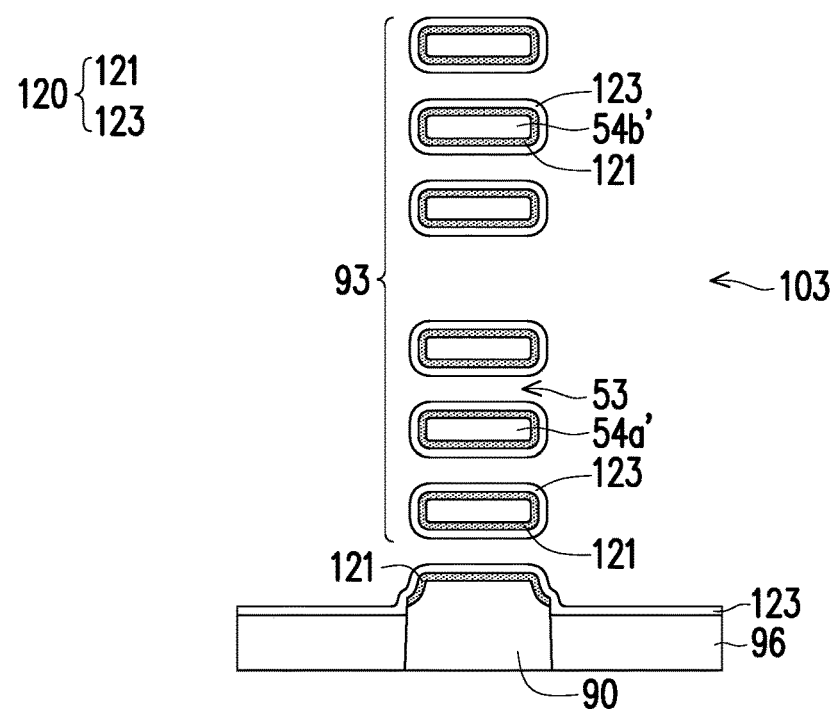

Next, in FIG. 7, the first semiconductor material 52 is removed to release the second semiconductor material 54. After the first semiconductor material 52 is removed, the second semiconductor material 54 forms a plurality of nanosheets 54' that extend horizontally (e.g., parallel to a major upper surface of the substrate 50). The nanosheets 54' may be collectively referred to as the channel regions 93 or the channel layers 93 of the CFET device 100 formed. As illustrated in FIG. 7, gaps 53 (e.g., empty spaces) are formed between the nanosheets 54' by the removal of the first semiconductor material 52.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas, where the etching gas comprises $F_2$ and HF, and the carrier gas may be an inert gas such as Ar, He, $N_2$, combinations thereof, or the like.

Next, an interfacial dielectric material 121 and a gate dielectric material 123 are successively formed around each of the nanosheets 54'. The different constituent materials are also formed over the exposed surfaces of the fins 90 and over the upper surface of the STI regions 96, as illustrated in FIG. 7, in the illustrated embodiment.

The interfacial dielectric material 121 is a suitable dielectric material, such as silicon oxide formed by a suitable method, such as CVD, PVD, ALD, thermal oxidation, or the like. In an embodiment, the interfacial dielectric material 121 is formed by converting an exterior portion of the nanosheets 54' (e.g., silicon) into an oxide (e.g., silicon oxide) through a thermal oxidization process. A thickness of the interfacial dielectric material 121 is between about 5 angstroms and about 20 angstroms, as an example.

Next, the gate dielectric material 123 is formed (e.g., conformally) around the nanosheets 54' and around the interfacial dielectric material 121. In accordance with some embodiments, the gate dielectric material 123 comprises silicon oxide, silicon nitride, or multilayers thereof. In some embodiments, the gate dielectric material 123 includes a high-k dielectric material, and in these embodiments, the gate dielectric material 123 may have a k value greater than about 7.0, and may include a metal oxide or a silicate of Hf, Al, Zr, La, Mg, Ba, Ti, or Pb, or combinations thereof. The formation methods of the gate dielectric material 123 may include Molecular-Beam Deposition (MBD), ALD, PECVD, and the like. As an example, the gate dielectric material 123 is $HfO_2$ formed by ALD, and has a thickness between about 10 angstroms and about 30 angstroms.

In some embodiments, liner material (not shown) and work function material (not shown) may be formed (e.g., conformally) around the nanosheets 54' and around the gate dielectric material 123. The interfacial dielectric material 121, the gate dielectric material 123, and the liner material and the work function material which may be formed are collectively referred to as a gate layer stack 120 in the discussion herein.

Figure 8:
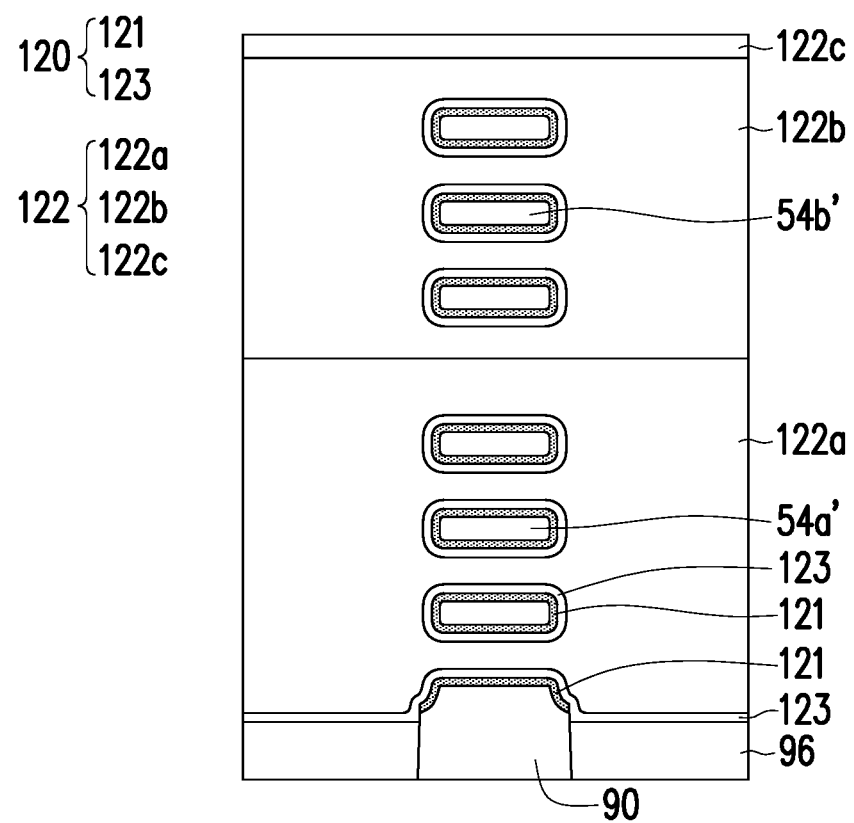

FIG. 8 illustrates forming a metal gate structure 122 over a semiconductor fin 90 and around a first nanosheet 54a' and a second nanosheet 54b'. In FIG. 8, a gate electrode material (e.g., an electrically conductive material) is formed in the recesses 103 to form the metal gate structures 122 including a first metal gate sections 122a and a second metal gate sections 122b. The first metal gate sections 122a and the second metal gate sections 122b fill the remaining portions of the recesses 103. The first metal gate sections 122a and the second metal gate sections 122b may include a metal-containing material such as TiN, TiO, TaN, TaC, Co, Ru, Al, W, combinations thereof, or multi-layers thereof. In some embodiments, an etching process may be performed after the filling of the first metal gate sections 122a to form a recess, and the second metal gate sections 122b may be formed by filling the recess. After the filling of the second metal gate sections 122b, a planarization process, such as a CMP, may be performed to remove the excess portions of the gate layer stack 120 and the material of the second metal gate sections 122b, which excess portions are over the top surface of the first ILD. The remaining portions of material of the first metal gate sections 122a, the second metal gate sections 122b, and the gate layer stack 120 thus form replacement gates of the resulting CFET device 100. Each metal gate structure 122 and the corresponding gate layer stack 120 may be collectively referred to as a gate stack, a replacement gate structure, or a metal gate structure. Each gate stack extends around the respective nanosheets 54'. As shown in FIG. 8, the metal gate structure 122 may include a first metal gate structure 122a around the first nanosheet 54a' and a second metal gate structure 122b around the second nanosheet 54b'. In some embodiments, the metal gate structure 122 may further include third metal gate sections 122c for better electrical coupling with a gate contact successively formed thereon.

Figure 9:
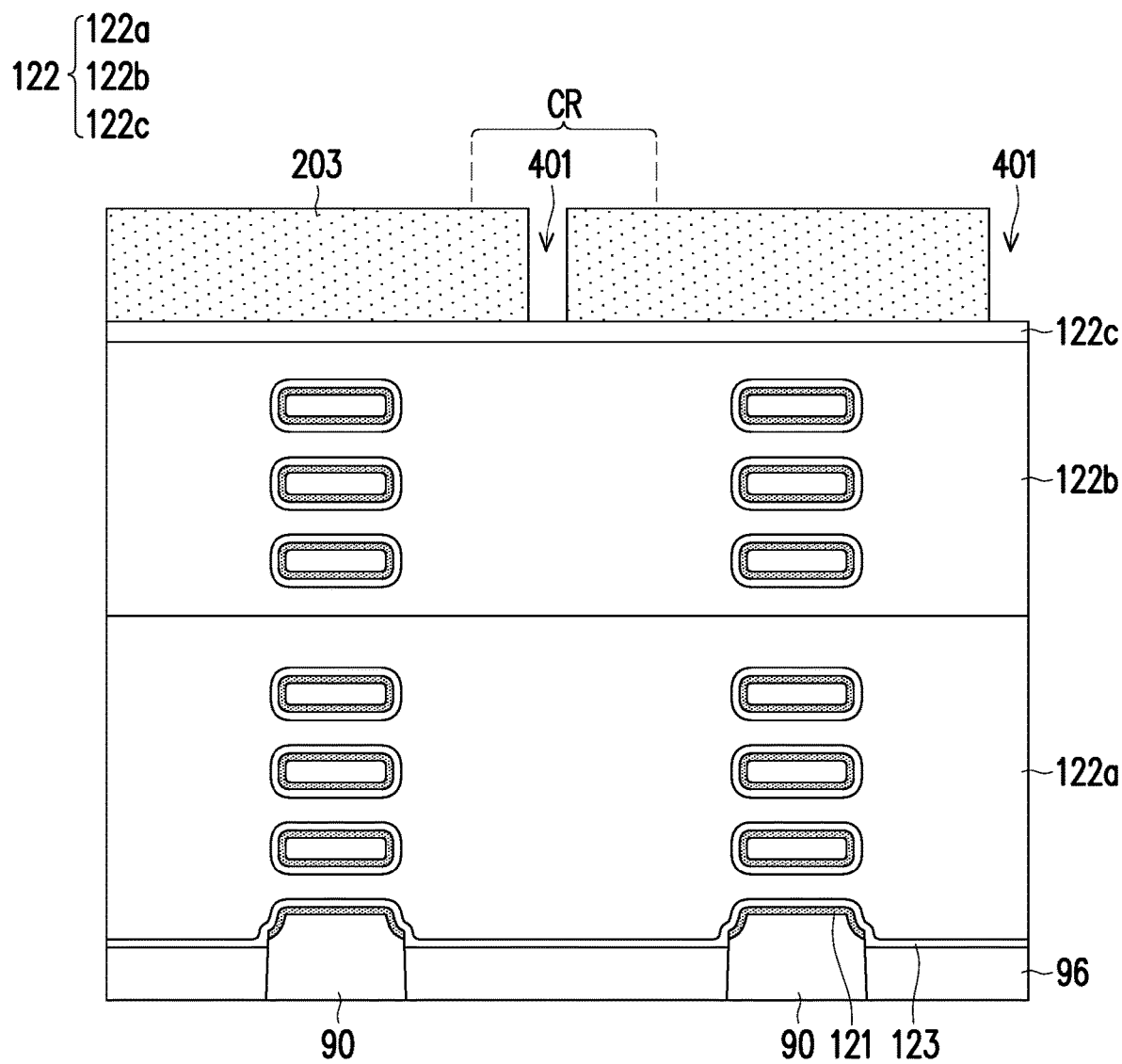

FIG. 9 illustrates forming a hard mask layer 203 over a metal gate structure 122 of a semiconductor device 100. In FIG. 9, once the metal gate structures 122 have been planarized, a series of hard mask layers may be formed over the planarized surface of the metal gate structures 122 and the ILD layer.

In some embodiments, a contact etch stop layer (not shown) may be formed over the planarized surfaces of the metal gate structures 122 and ILD layer by depositing a material such as Si, TiN, SiN, $SiO_2$, combinations thereof, or the like.

The hard mask layer 203 may be formed over the contact etch stop layer from a second hard mask material such as SiN, $SiO_2$, combinations thereof, or the like. The second hard mask material used to form the hard mask layer 203 is different from the first hard mask material used to form the contact etch stop layer. As such, the contact etch stop layer may serve as an etch stop of a subsequent patterning of the hard mask layer 203. According to some embodiments, the hard mask layer 203 may be placed over the contact etch stop layer using a deposition method such as atomic layer deposition (ALD), plasma enhanced chemical vapor deposition (PECVD), chemical vapor deposition (CVD), or the like. However, any suitable materials and any suitable process may be used to form the hard mask layer 203.

Next, a photo resist layer may be deposited over the hard mask layer 203, and may be patterned to form openings through the photo resist layer to expose surfaces of the hard mask layer 203 in areas overlying one or more of the metal gate structures 122.

Next, transferring the pattern of the photo resist layer into the hard mask layer 203 using a first etchant to form a pattern of openings 401 through the hard mask layer 203. In some embodiments, the first etchant may use reactant gasses have a greater etching selectivity for the second hard mask material used to form the hard mask layer 203 than the first hard mask material used to form the first hard mask layer. As such, the first hard mask layer serves as a contact etch stop layer and areas of the first mask layer overlying the one or more of the metal gate structures 122 are exposed through the openings 401. In other words, a first opening 401 through the hard mask layer 203 is formed in a cut metal gate region CR of the semiconductor device 100. The top surface of the metal gate structure 122 may remain level after the forming the first opening 401. Once the openings 401 have been formed, the remaining photo resist layer is removed.

Figure 10:
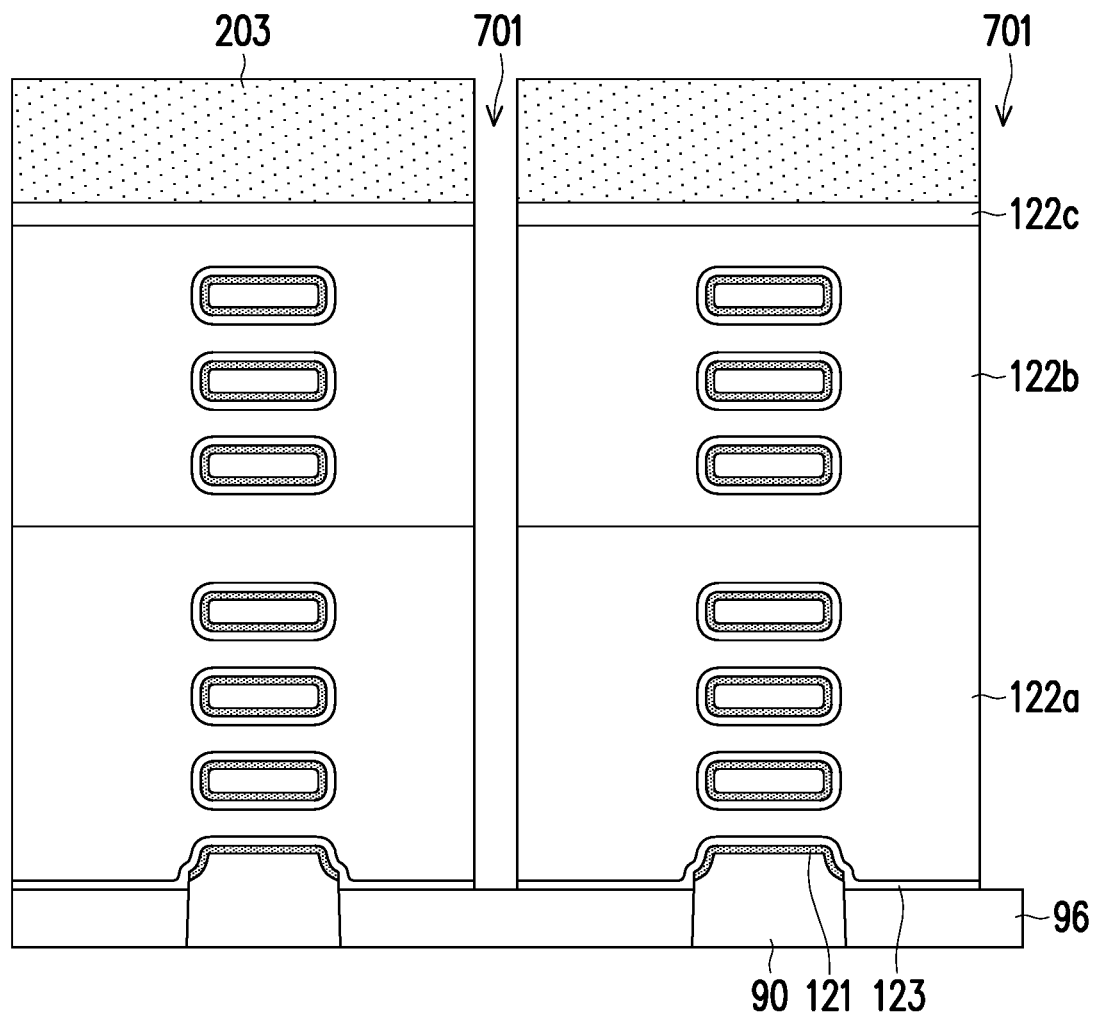

FIG. 10 illustrates performing a first etch process to anisotropically etch the metal gate structure 122. In FIG. 10, an anisotropic etching process is performed to remove the exposed portions of the areas of the first mask layer and to remove the one or more target portions of the metal gate structures 122 in order to form CMG trenches 701. This CMG etching process separates the one or more target portions of the metal gate structures 122 into first metal gate sections 122a and second metal gate sections 122b, effectively "cutting" the first sections from the second sections as shown in the cut view of FIG. 10. According to some embodiments, the CMG etching process comprises a dry etching using chlorine-containing or fluorine-containing gases, such as $Cl_2$, $NF_3$, $SiCl_4$, $BCl_3$, $O_2$, $N_2$, $H_2$, Ar, combinations thereof or the like. However, any suitable dry etching gases may be used for the CMG etching process. In some embodiments, the first etch process is a dry etch process.

Figure 11:
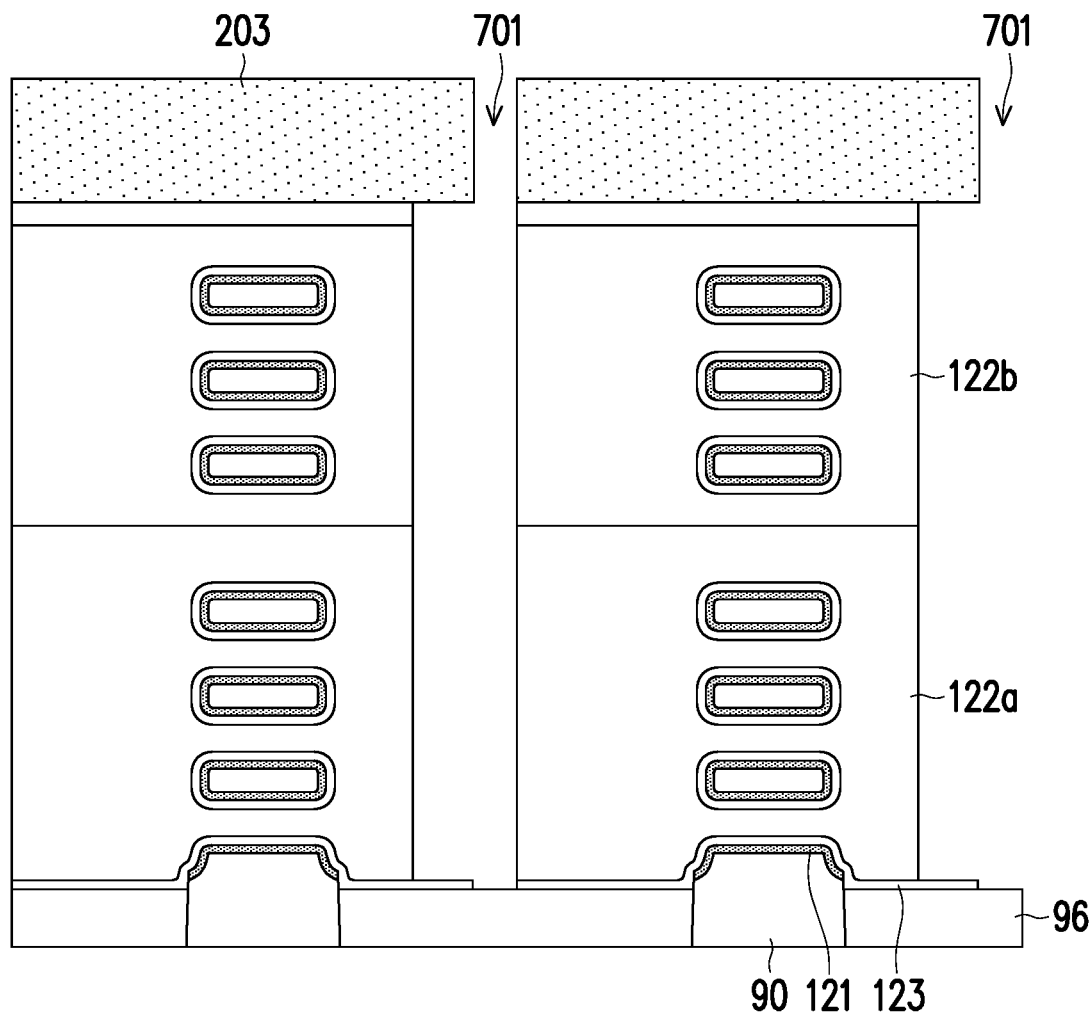

FIG. 11 illustrates performing a second etch process to isotropically etch the metal gate structure 122 such that a first trench (or CMG trenches 701) is formed after the first etch process and the second etch process. In FIG. 11, an isotropic etching process is performed to remove a portion of the material of the metal gate structures 122 from the sidewall of the CMG trenches 701 to further expand the width of the CMG trenches 701. As shown in FIG. 11, the CMG trenches 701 expose a dielectric layer 123 over a fin 90 of the semiconductor device 100. In some embodiments, a sidewall of the metal gate structure 122 is offset by a distance DS range from 0.5 nm to 39.5 nm after the performing the isotropic etch process. In some embodiments, a distance D1 between a sidewall of the metal gate structure 122 and the first nanosheet 54a' is in a range from 0.5 nm to 40 nm after the performing the isotropic etch process. In some embodiments, the second etch process is a wet etch process. In some other embodiments, the second etch process may be a dry etch process.

Figure 12:
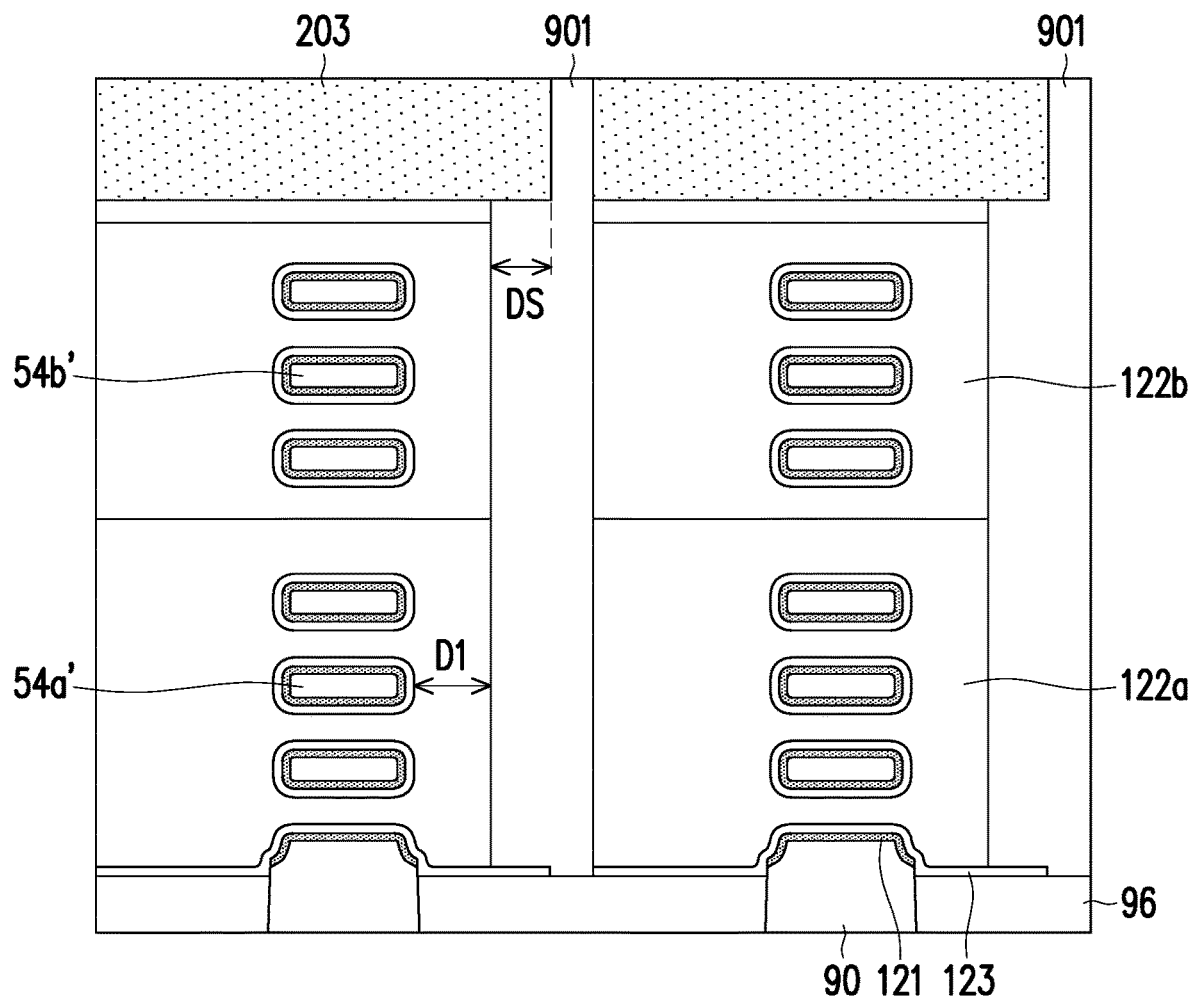

In FIG. 12 illustrates a deposition of a CMG fill material 901 over the CMG trenches 701 in FIG. 11. The first trenches (CMG trenches) 701 are filled with the first dielectric material (first CMG refill material) 901 is a dielectric material such as silicon nitride (SiN), silicon oxycarbide (SiOC), and/or silicon oxycarbonitride (SiOCN), wherein carbon is between about 1% and 10% of the compound by weight and/or wherein nitrogen is less than about 50% of the compound by weight, and may be represented by the formula $(Si)_{(1-y)}N_y$, $(SiO)_{(1-x)}C_x$, and/or $(SiO)_{(1-x-y)}C_xN_y$, wherein x=0.01-0.1 and y<0.5. The first CMG refill material 901 may be deposited using a deposition processes such as PECVD, ALD, CVD, or the like. In some embodiments, the hard mask layer 203 remained on the metal gate structures 122 after deposition of the CMG fill material 901. In an embodiment, the first CMG refill material 901 may overfill the CMG trenches 701 to a level above the top surface of the hard mask layer 203.

Next, a planarization of the first CMG refill material 901 may be performed using, for example, a chemical mechanical (CMP) planarization process to remove the excess material of the first CMG refill material 901. The CMP planarization process may continue until surfaces of the first CMG refill material 901 level with the top surface of the hard mask layer 203. In other words, the first dielectric material 901 may be planarized with the hard mask layer 203.

Figure 13:
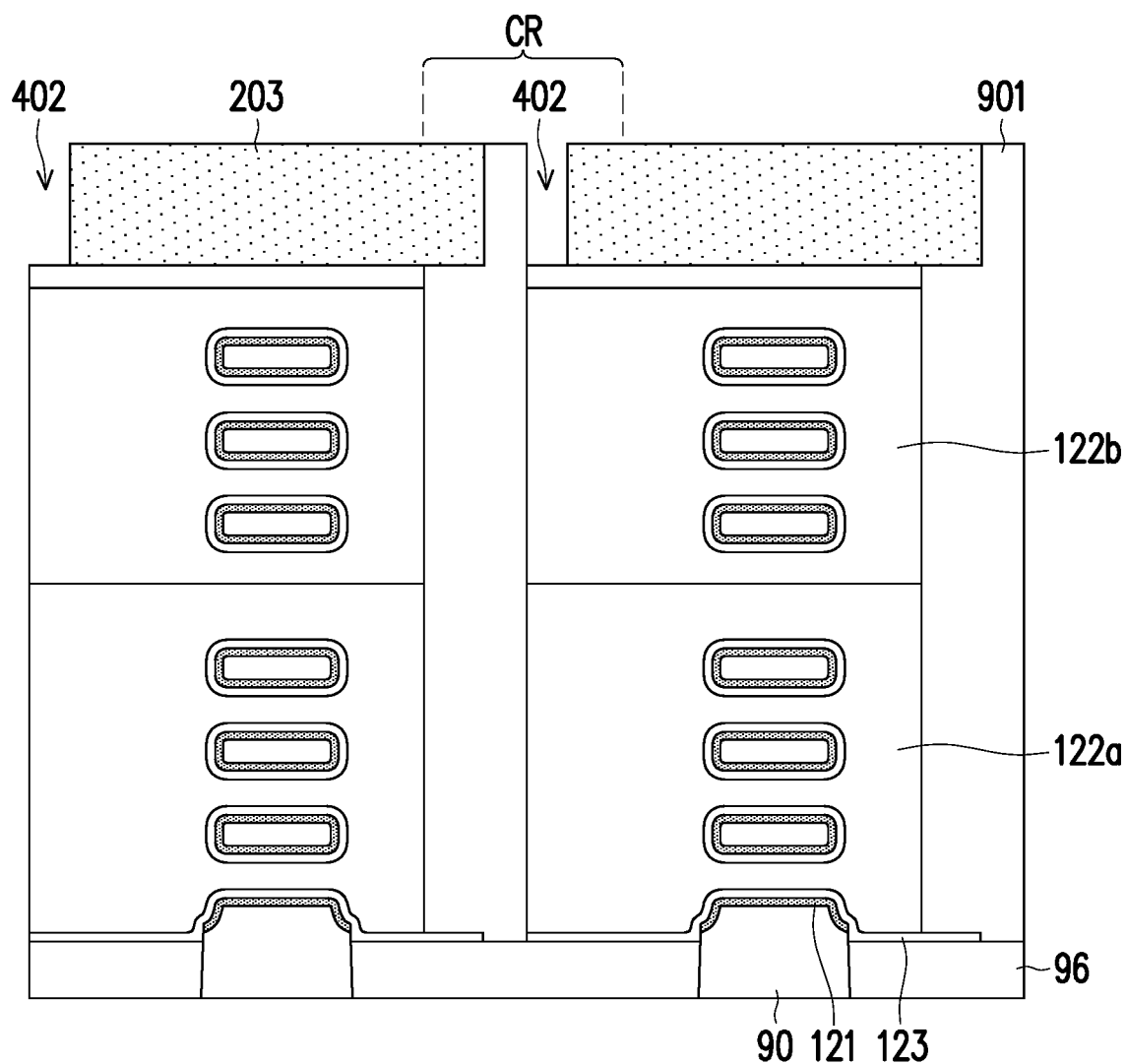

FIG. 13 illustrates forming a second opening 402 through the hard mask layer 203 in the cut metal gate region CR of the semiconductor device 100, using similar process as above.

Figure 14:
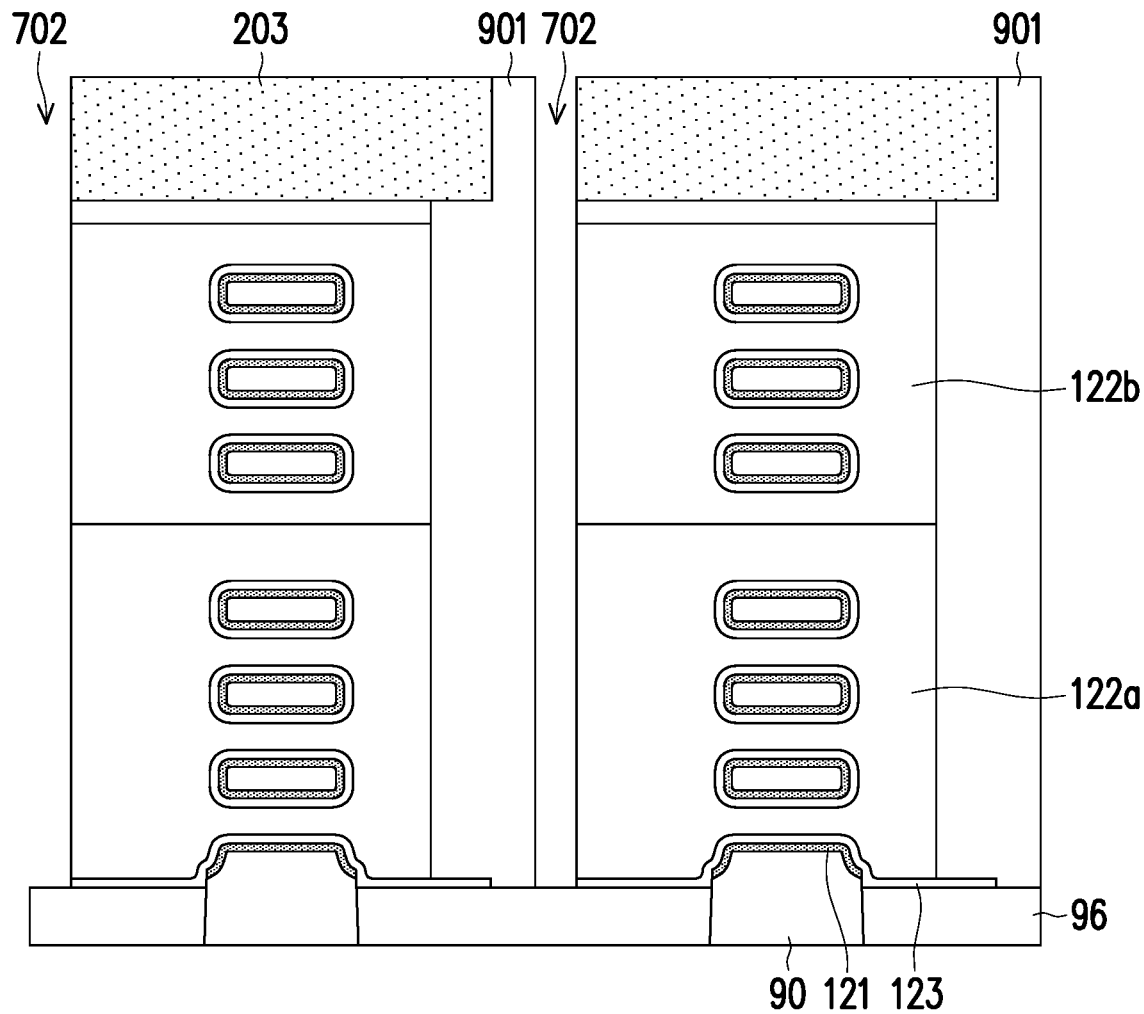

FIG. 14 illustrates performing a third etch process to anisotropically etch the metal gate structure 122 such that a second trench 702 is formed after the third etch process. Specifically, an anisotropic etching process is performed to remove the exposed portions of the areas of the first mask layer and to remove the one or more target portions of the metal gate structures 122 in order to form CMG trenches 702, using similar process as above. The second trench 702 may expose the dielectric layer (for example, the gate dielectric material 123) over the fin 90 of the semiconductor device 100.

Figure 15:
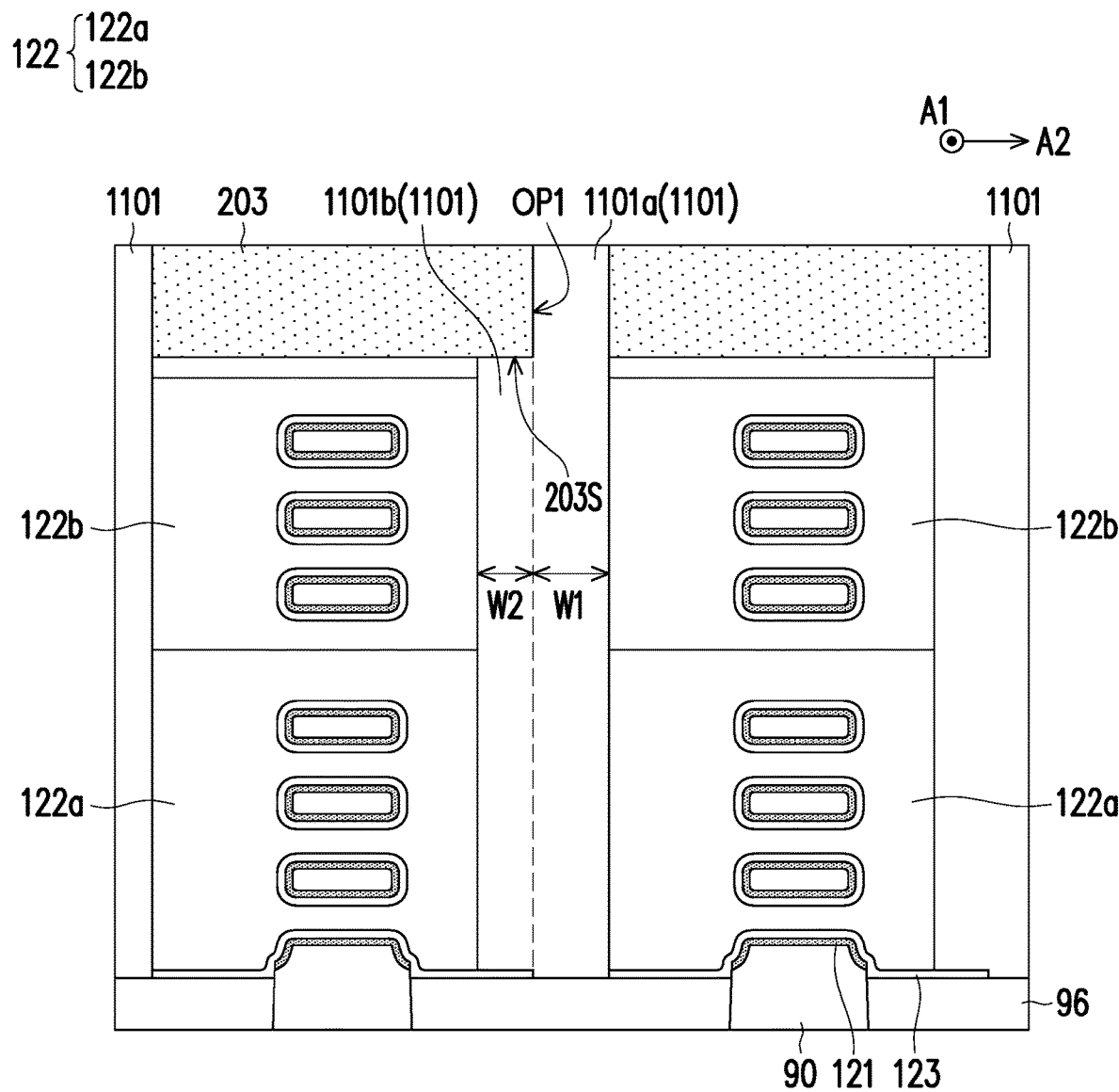
Figure 16A:
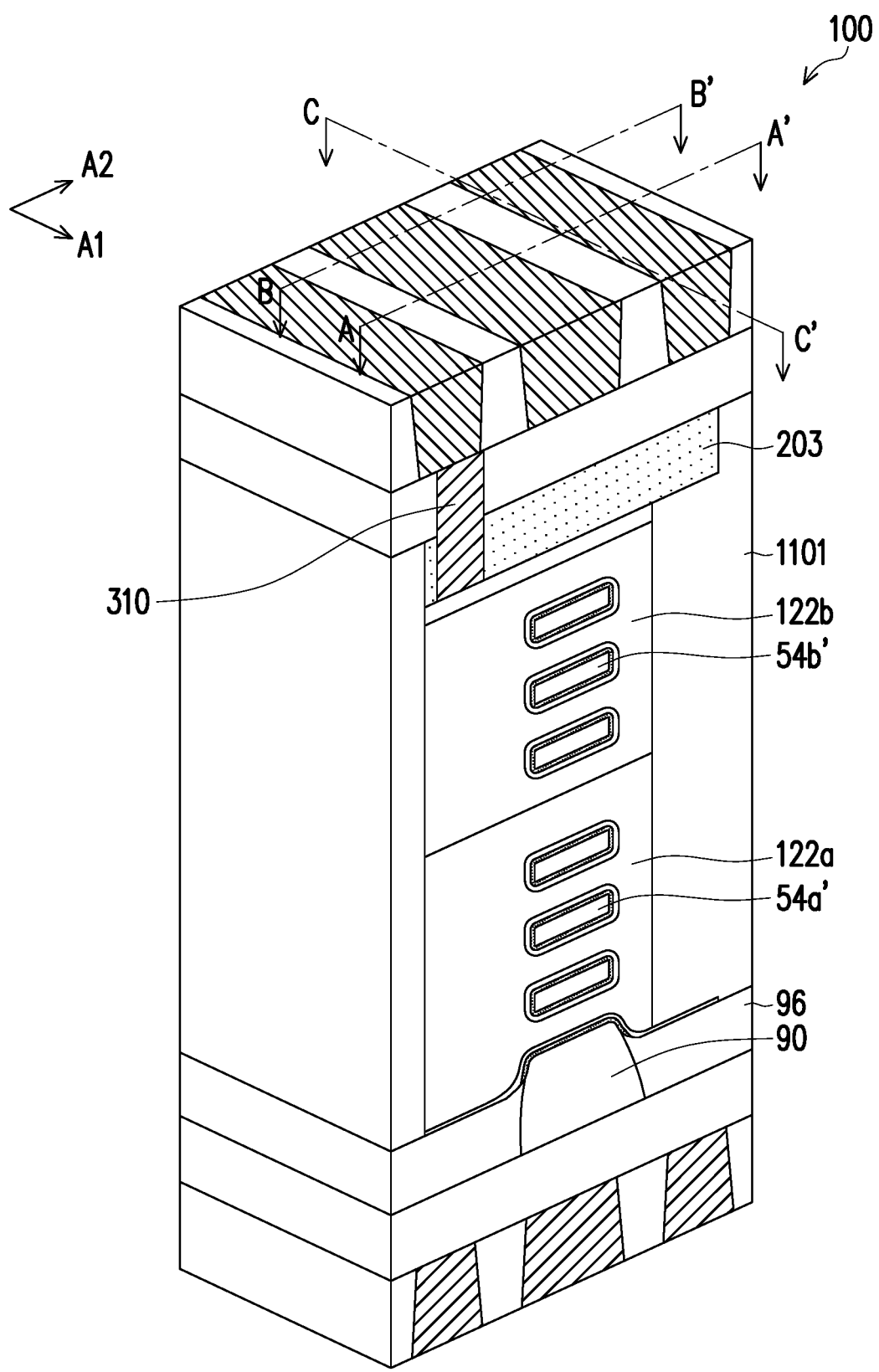

FIG. 15 illustrates filling the second trench 702 with the first dielectric material 901 and planarizing the first dielectric material 901 with the hard mask layer 203 after filling the second trench 702. In FIG. 15, a deposition of a CMG fill material 901 over the CMG trenches 702 in FIG. 14 and a planarization of the first CMG refill material 901 may be performed. As such, CMG plugs 1101 may be formed from remaining material of the CMG refill material 901.

In FIGS. 16A-16D, forming third openings 403 through the hard mask layer 203 using a patterned photo resist layer using any suitable process. The openings expose surfaces of the metal gate structures 122 for forming metal contacts for the metal gate structures 122. Gate contacts 310 may be formed through the hard mask layer 203 in a respective third opening 403 to electrically couple to the metal gate structure 122.

As shown in FIGS. 16A-16D, the semiconductor device 100 including a fin 90, first source/drain regions 112a, second source/drain regions 112b, a first nanosheet 54a', a second nanosheet 54b' and a metal gate structure 122. The fin 90 extends in a first direction A1 and protruding above an insulator 96. The first source/drain regions 112a are over the fin 90. The second source/drain regions 112b are over the first source/drain regions 112a. The first nanosheet 54a' extends in the first direction A1 between the first source/drain regions 112a. The second nanosheet 54b' extends in the first direction A1 between the second source/drain regions 112b. The metal gate structure 122 is over the fin 90 and between the first source/drain regions 112a. The metal gate structure 122 extends in a second direction A2 different from the first direction A1 from a first sidewall 122W1 to a second sidewall 122W2. A first distance D1 in the second direction A2 between the first nanosheet 54a' and the first sidewall 122W1 of the metal gate structure 122 is smaller than a second distance D2 in the second direction A2 between the first nanosheet 54a' and the second sidewall 122W2 of the metal gate structure 122. In other words, the metal gate structure 122 may have a shorter "wing". In some embodiments, a ratio between the first distance D1 and the second distance D2 is in a range from 0.0125 to 0.9875. In some embodiments, a ratio between the first distance D1 and a width WN of the first nanosheet 54a' is in a range from 0.01 to 3.95.

Figure 16B:
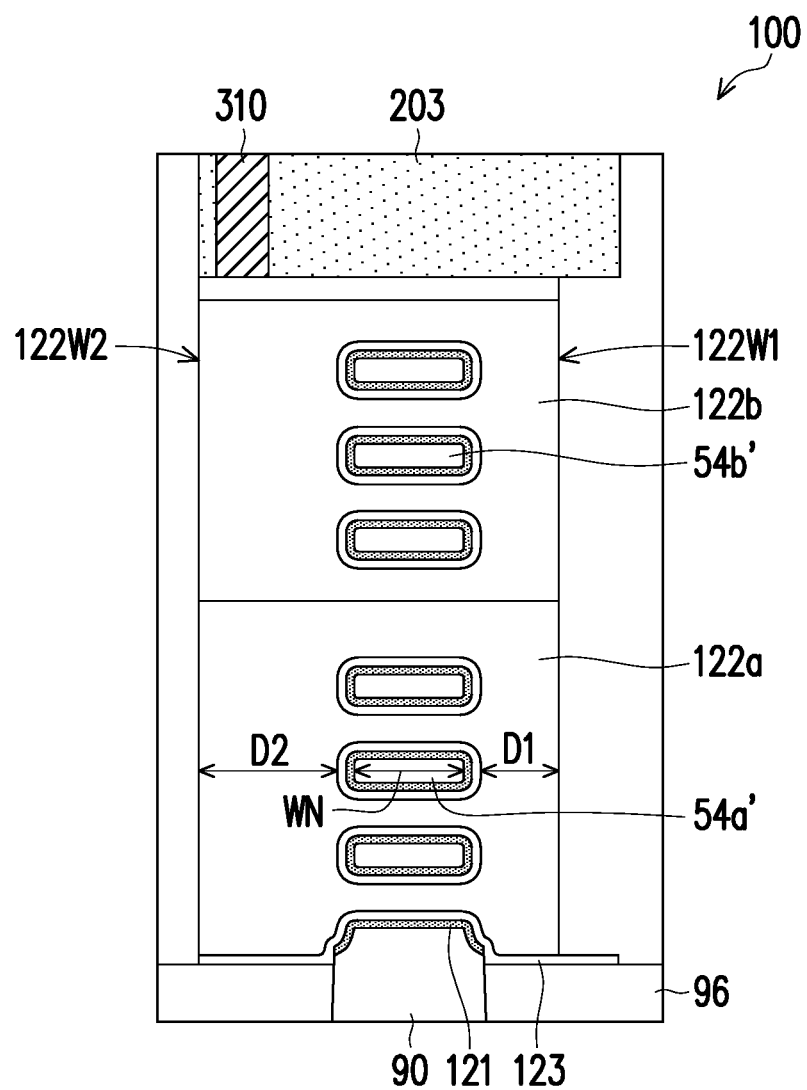
Figure 16C:
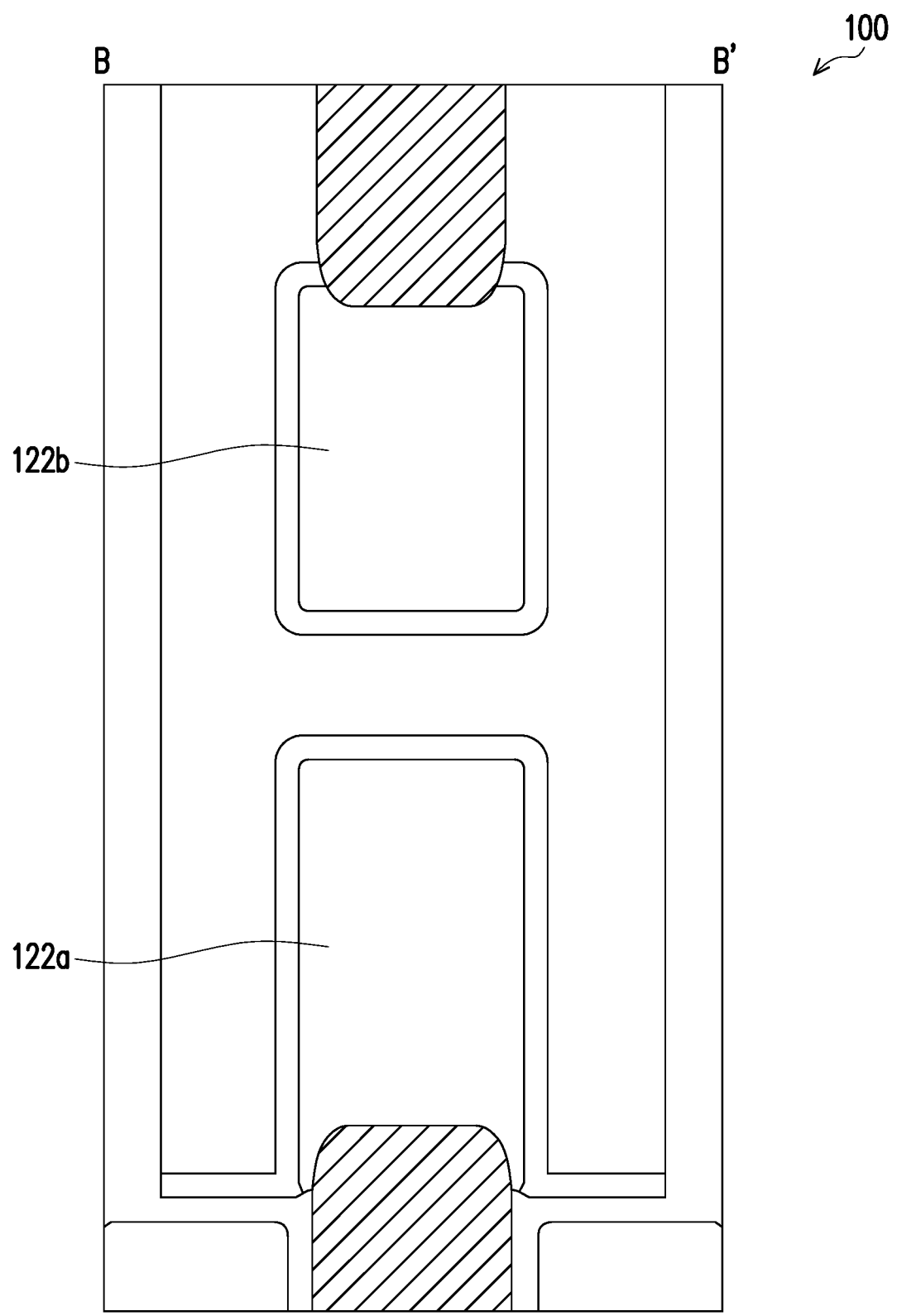
Figure 16D:
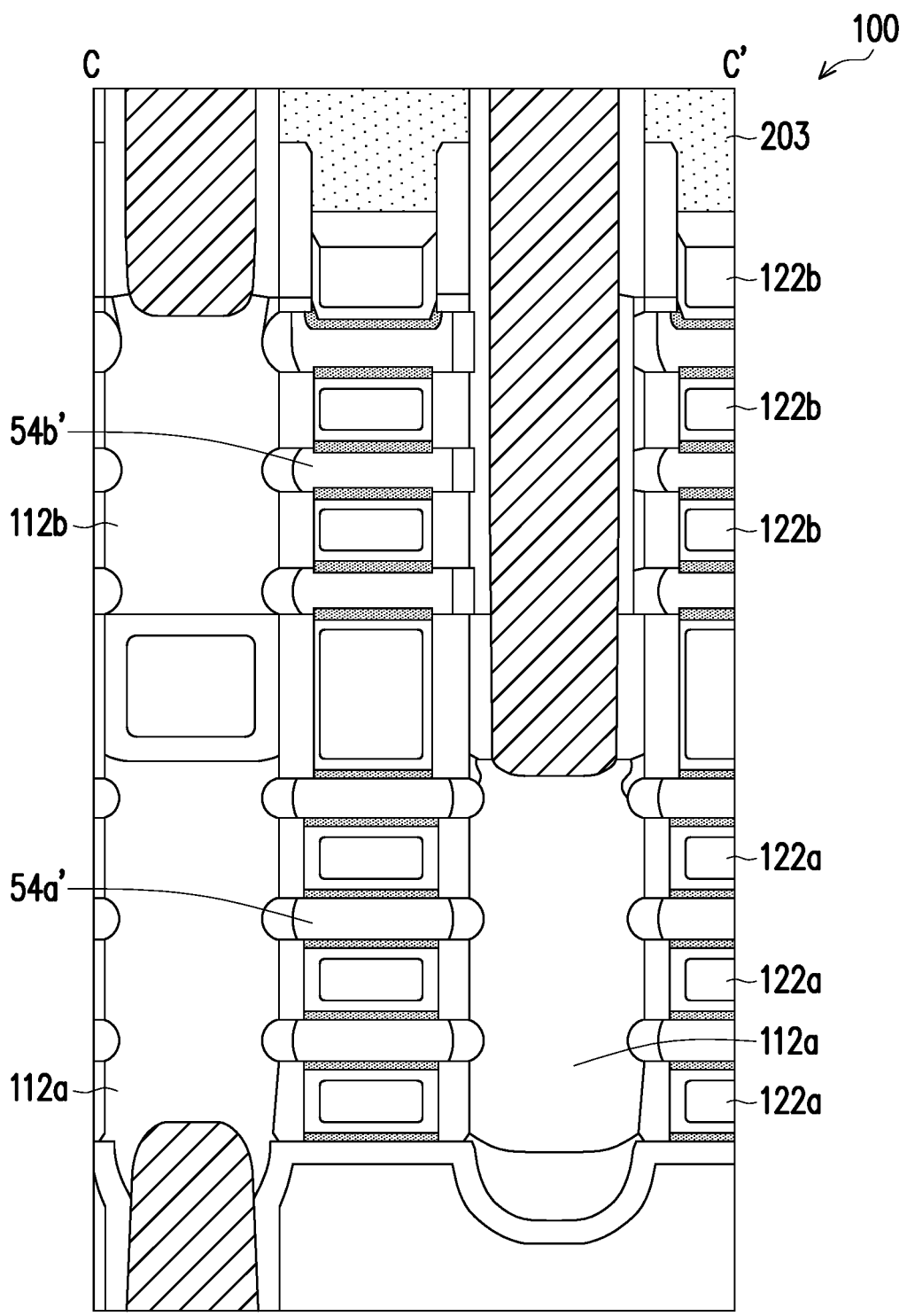

The semiconductor device 100 may further include a gate contact 310 over and electrically connected to the metal gate structure 122. As shown in FIG. 16B, the gate contact 310 is between the second sidewall 122W2 of the metal gate structure 122 and the first nanosheet 54a' in the second direction A2. In other words, the gate contact 310 does not overlap with the first nanosheet 54a'.

Referring to FIGS. 15 and 16A, the semiconductor device 100 further includes a hard mask layer 203 and a CMG plug 1101. The hard mask layer 203 and the CMG plug 1101 may be formed of different materials or the same material, as described above. The hard mask layer 203 may be disposed above the metal gate structure 122. As shown in FIG. 15, the CMG plug 1101 may include a first portion 1101a and a second portion 1101b. The first portion 1101a of the CMG plug 1101 may have a substantially constant first width W1 in the second direction A2. The second portion 1101b of the CMG plug 1101 may have a substantially constant second width W2 in the second direction A2. The first portion 1101a is disposed in a first opening OP1 through the hard mask layer 203. The second portion 1101b may be positioned between the first portion 1101a and the metal gate structure 122. As shown in FIG. 15, the second portion 1101b directly contacts a bottom surface 203S of the hard mask layer 203. In other words, a portion of the CMG plug 1101 directly contacts the bottom surface 203S of the hard mask layer 203. In some embodiments, the second width W2 of the second portion 1101b of the CMG plug 1101 is in a range from 0.5 nm to 39.5 nm.

In some embodiments, the semiconductor device 100 further includes a dielectric material layer (for example, the gate dielectric material 123) over the fin 90 and the STI regions 96. As shown in FIG. 15, the CMG plug 1101 directly contacts the gate dielectric material 123, for example, a portion of the gate dielectric material 123 over the STI regions 96.

FIGS. 17-21 illustrate manufacturing of a complementary field-effect transistor (CFET) device 200 at various stages, in accordance with an embodiment. FIGS. 17-21 are cross-sectional views along cross-section A-A' in FIG. 4A.

Figure 17:
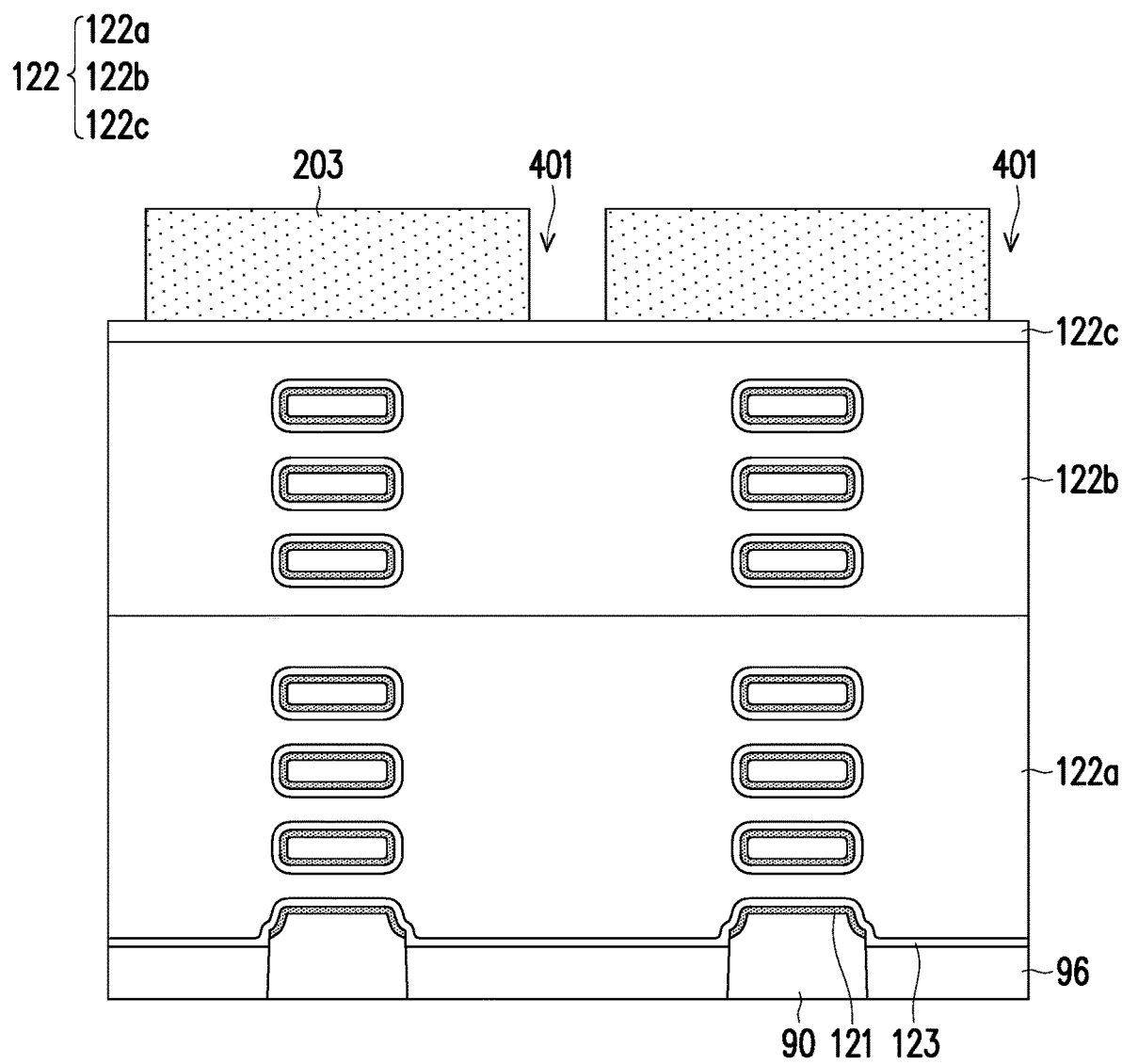
FIGS. 17-21 are cross-sectional views of a CFET device at various stages of manufacturing, in accordance with an embodiment.

FIG. 17 illustrates forming openings 401 through the hard mask layer 203 in the cut metal gate region CR of the semiconductor device 200, using similar process as above.

Figure 18:
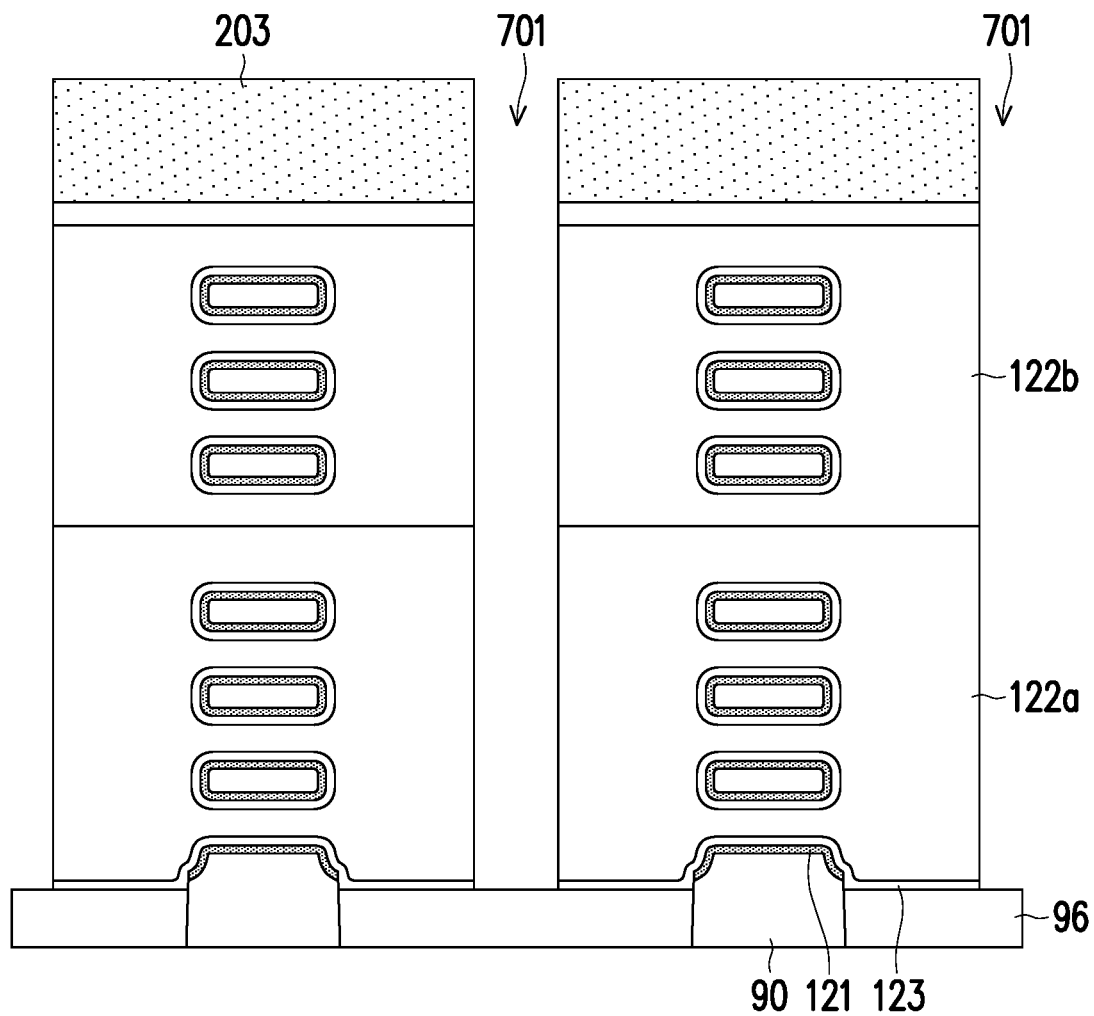

FIG. 18 illustrates performing an anisotropic etch process to form first trenches 701 through the metal gate structure 122 in a cut metal gate region CR. In FIG. 18, an anisotropic etching process is performed to remove the exposed portions of the areas of the first mask layer and to remove the one or more target portions of the metal gate structures 122 in order to form CMG trenches 701, using similar process as above.

Figure 19:
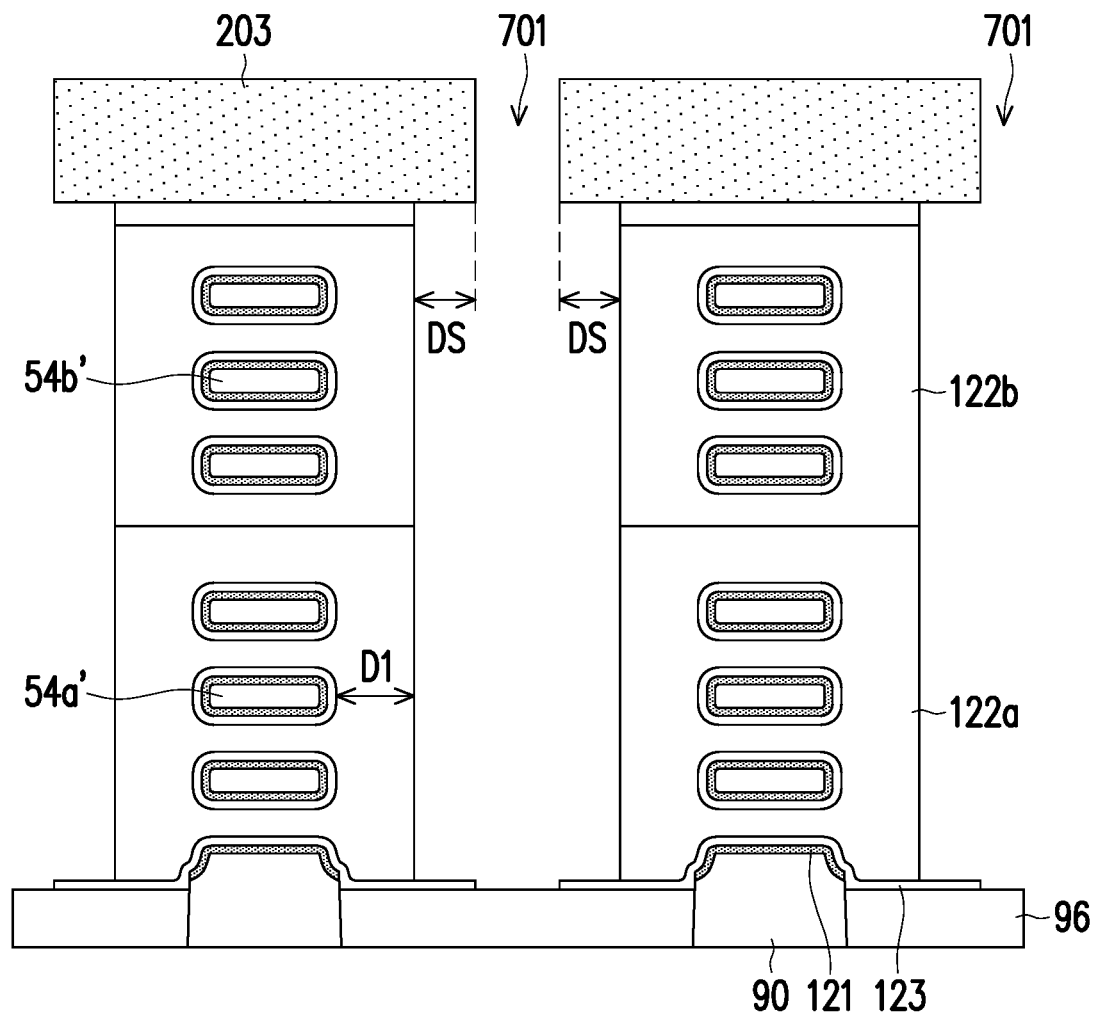

FIG. 19 illustrates performing an isotropic etch process to laterally etch the metal gate structure 122 in the first trench 701. In FIG. 19, an isotropic etching process is performed to remove a portion of the material of the metal gate structures 122 from the sidewall of the CMG trenches 701 to further expand the width of the CMG trenches 701. In some embodiments, a sidewall of the metal gate structure 122 is offset by a distance DS range from 0.5 nm to 39.5 nm after the performing the isotropic etch process. In some embodiments, a distance D1 between a sidewall of the metal gate structure 122 and the first nanosheet 54a' is in a range from 0.5 nm to 40 nm (a range from 10 nm to 40 nm in some embodiments) after the performing the isotropic etch process.

Figure 20:
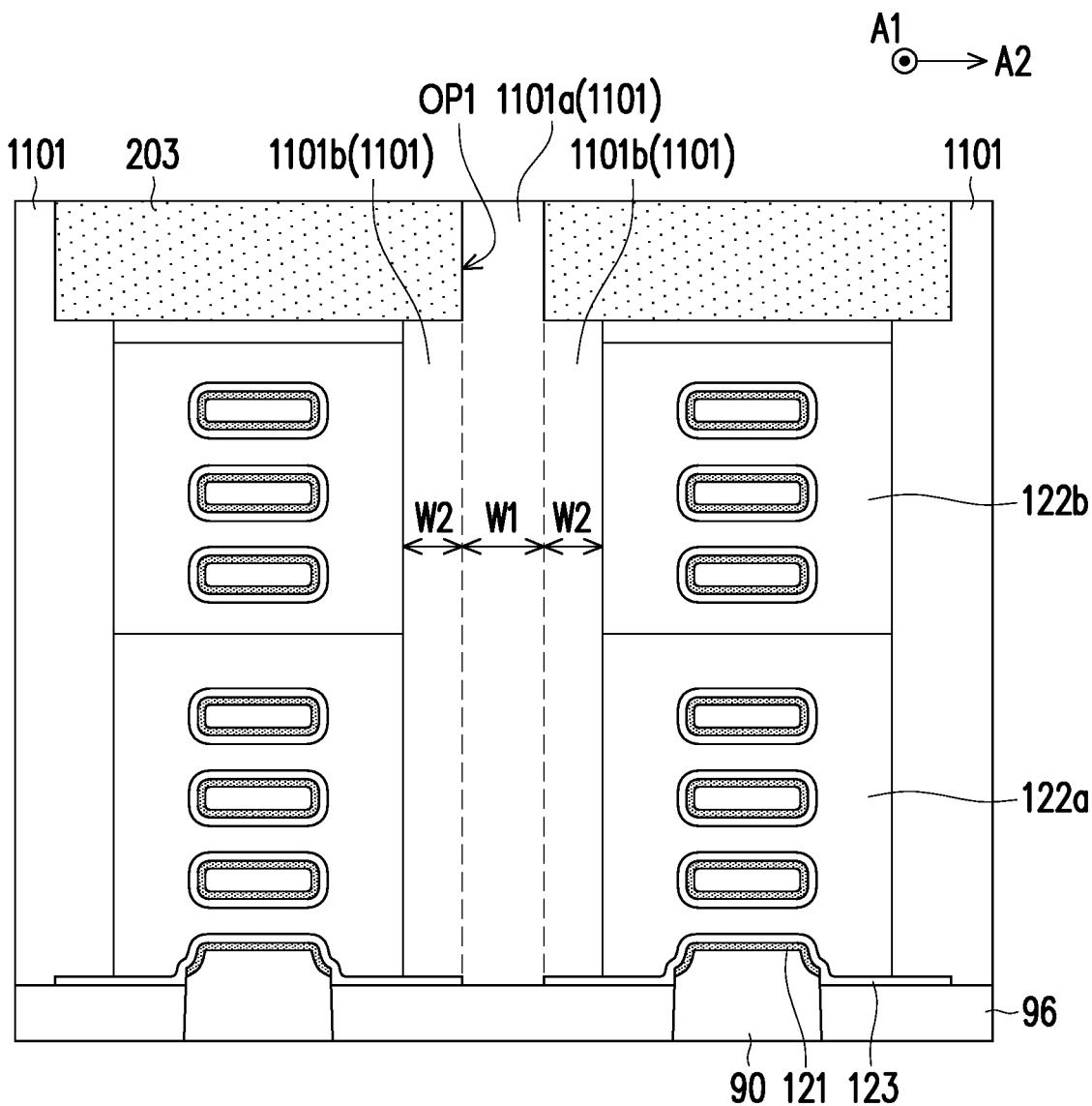

FIG. 20 illustrates filling the first trench 701 with a dielectric material 901. In FIG. 20, a deposition of a CMG fill material 901 over the CMG trenches 701 in FIG. 19 and a planarization of the first CMG refill material 901 may be performed. As such, CMG plugs 1101 may be formed from remaining material of the CMG refill material 901 disposed within the CMG trenches 701.

Figure 21:
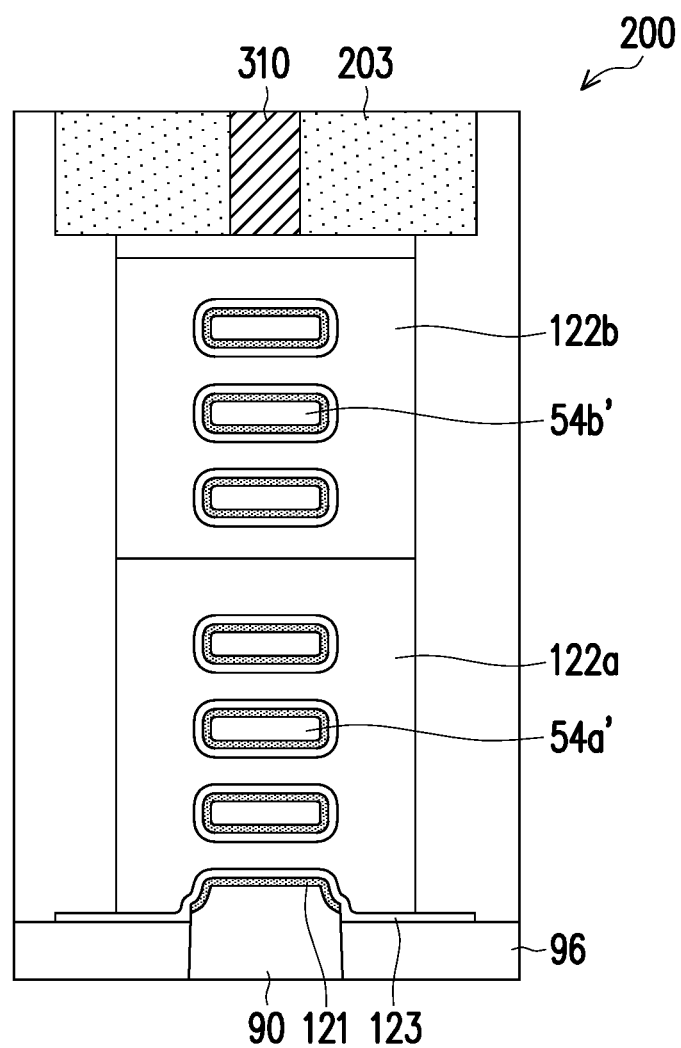

In FIG. 21, forming openings through the hard mask layer 203 using a patterned photo resist layer using any suitable process. The openings expose surfaces of the metal gate structures 122 for forming metal contacts 310 for the metal gate structures 122. Gate contacts 310 may be formed through the hard mask layer 203 to electrically couple to the metal gate structure 122.

Referring to FIGS. 20 and 21, the semiconductor device 200 is similar to the semiconductor device 100 shown in FIGS. 16A-16D, except that the gate contact 310 of the semiconductor device 200 is overlapped with the first nanosheet. Similar to the semiconductor device 100, the CMG plug 1101 of the semiconductor device 200 may also include a first portion 1101a and a second portion 1101b. The first portion 1101a of the CMG plug 1101 may have a substantially constant first width W1 in the second direction A2. The second portion 1101b of the CMG plug 1101 may have a substantially constant second width W2 in the second direction A2. The first portion 1101a is disposed in a first opening OP1 through the hard mask layer 203. The second portion 1101b may be positioned between the first portion 1101a and the metal gate structure 122. In some embodiments, the second width W2 of the second portion 1101b of the CMG plug 1101 is in a range from 0.5 nm to 39.5 nm (a range from 0.5 nm to 30 nm in some embodiments).

In the present disclosure, the CMG plugs may be formed by an isotropic etching process to laterally etch the metal gate structure 122 in a trench formed by a former anisotropic etching process. As such, capacity of the semiconductor device may be reduced for an improved speed performance while maintaining acceptable process control and better manufacturing yield.

In accordance with some embodiments of the present disclosure, a semiconductor device including a fin, first source/drain regions, second source/drain regions, a first nanosheet, a second nanosheet and a metal gate structure. The fin extends in a first direction and protrudes above an insulator. The first source/drain regions are over the fin. The second source/drain regions are over the first source/drain regions. The first nanosheet extends in the first direction between the first source/drain regions. The second nanosheet extends in the first direction between the second source/drain regions. The metal gate structure is over the fin and between the first source/drain regions. The metal gate structure extends in a second direction different from the first direction from a first sidewall to a second sidewall. A first distance in the second direction between the first nanosheet and the first sidewall of the metal gate structure is smaller than a second distance in the second direction between the first nanosheet and the second sidewall of the metal gate structure.

In accordance with some embodiments of the present disclosure, a method including forming a hard mask layer over a metal gate structure of a semiconductor device; forming a first opening through the hard mask layer in a cut metal gate region of the semiconductor device; performing a first etch process to anisotropically etch the metal gate structure; performing a second etch process to isotropically etch the metal gate structure such that a first trench exposing a dielectric layer over a fin of the semiconductor device is formed after the first etch process and the second etch process; and filling the first trench with a first dielectric material.

In accordance with some embodiments of the present disclosure, a method including forming a metal gate structure over a semiconductor fin and around a first nanosheet and a second nanosheet, wherein the first nanosheet extends between first source/drain regions, and the second nanosheet extends between second source/drain regions over the first source/drain regions; performing an anisotropic etch process to form a first trench through the metal gate structure in a cut metal gate region, wherein the anisotropic etch process removes material of the metal gate structure; performing an isotropic etch process to laterally etch the metal gate structure to form a second trench adjacent the first trench, wherein the isotropic etch process removes the material of the metal gate structure; and filling the first trench and the second trench with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a hard mask layer over a metal gate structure of a semiconductor device;
    forming a first opening through the hard mask layer in a cut metal gate region of the semiconductor device;
    performing a first etch process to anisotropically etch the metal gate structure;
    performing a second etch process to isotropically etch the metal gate structure such that a first trench exposing a dielectric layer over a fin of the semiconductor device is formed after the first etch process and the second etch process; and
    filling the first trench with a first dielectric material.

2. The method of claim 1 further comprising planarizing the first dielectric material with the hard mask layer.

3. The method of claim 1 further comprising:
    forming a second opening through the hard mask layer in the cut metal gate region of the semiconductor device;
    performing a third etch process to anisotropically etch the metal gate structure such that a second trench exposing the dielectric layer over the fin of the semiconductor device is formed after the third etch process; and
    filling the second trench with the first dielectric material.

4. The method of claim 3 further comprising planarizing the first dielectric material with the hard mask layer after the filling the second trench.

5. The method of claim 1, wherein the first etch process is a dry etch process.

6. The method of claim 1, wherein the second etch process is a dry etch process.

7. The method of claim 1, wherein the second etch process is a wet etch process.

8. The method of claim 1 further comprising forming a third opening through the hard mask layer and forming a gate contact in the third opening.

9. A method, comprising:
    forming a metal gate structure over a semiconductor fin and around a first nanosheet and a second nanosheet, wherein the first nanosheet extends between first source/drain regions, and the second nanosheet extends between second source/drain regions over the first source/drain regions;
    performing an anisotropic etch process to form a first trench through the metal gate structure in a cut metal gate region, wherein the anisotropic etch process removes material of the metal gate structure;
    performing an isotropic etch process to laterally etch the metal gate structure to form a second trench adjacent the first trench, wherein the isotropic etch process removes the material of the metal gate structure; and
    filling the first trench and the second trench with a dielectric material.

10. The method of claim 9, wherein a sidewall of the metal gate structure is offset by a distance range from 0.5 nm to 40 nm after the performing the isotropic etch process.

11. The method of claim 9, wherein a distance between a sidewall of the metal gate structure and the first nanosheet is in a range from 0.5 nm to 40 nm after the performing the isotropic etch process.

12. A method, comprising:
forming a patterned hard mask layer over a gate structure of a semiconductor device, wherein a first opening of the patterned hard mask layer is in a cut metal gate region of the semiconductor device;
performing a first removal process to anisotropically remove the gate structure;
after performing the first removal process, performing a second removal process to isotropically remove the gate structure such that a first trench exposing a dielectric layer over a fin of the semiconductor device is formed after the first removal process and the second removal process; and
filling the first trench with a first dielectric material.

13. The method of claim 12 further comprising planarizing the first dielectric material.

14. The method of claim 12 further comprising:
forming a second opening in the patterned hard mask layer, wherein the second opening is in the cut metal gate region of the semiconductor device;
performing a third removal process to anisotropically remove the gate structure such that a second trench exposing the dielectric layer over the fin of the semiconductor device is formed after the third removal process; and
filling the second trench with the first dielectric material.

15. The method of claim 14 further comprising planarizing the first dielectric material.

16. The method of claim 14, wherein the third removal process is a wet etch process.

17. The method of claim 12, wherein the first removal process is a dry etch process.

18. The method of claim 12, wherein the second removal process is a dry etch process.

19. The method of claim 12, wherein the second removal process is a wet etch process.

20. The method of claim 12 further comprising forming a third opening through the patterned hard mask layer and forming a gate contact in the third opening.

* * * * *